United States Patent [19]
Anderson et al.

[11] Patent Number: 5,903,829
[45] Date of Patent: *May 11, 1999

[54] RF EQUALIZER MODULE

[75] Inventors: Andrew Reino Anderson, Golden Valley; Glen Brian Backes, St. Cloud; Richard Thomas Demulling, Circle Pines; Dominic Louwagie, Eden Prairie; Todd Charles Ortberg, Chanhassen; Edward F. Sansone, Coon Rapids, all of Minn.

[73] Assignee: ADC Telecommunications, Inc., Minnetonka, Minn.

[*] Notice: This patent issued on a continued prosecution application filed under 37 CFR 1.53(d), and is subject to the twenty year patent term provisions of 35 U.S.C. 154(a)(2).

[21] Appl. No.: 08/761,776

[22] Filed: Dec. 6, 1996

[51] Int. Cl.⁶ .................................................. H04B 1/08
[52] U.S. Cl. ........................... 455/347; 455/6.2; 455/349; 361/752
[58] Field of Search .......................... 455/300, 301, 455/344, 347, 348, 349, 351, 575, 90, 3.1, 3.2, 3.3, 6.1, 6.3; 361/785, 752, 814, 816, 796, 801, 802, 733; 174/35 R; 439/61, 610, 668

[56] References Cited

U.S. PATENT DOCUMENTS

| 4,661,998 | 4/1987 | Yamashita et al. ............... 455/347 |
| 4,813,886 | 3/1989 | Roos et al. |
| 5,355,532 | 10/1994 | Kubo et al. ........................ 455/349 |
| 5,526,525 | 6/1996 | Minowa et al. .................... 455/347 |
| 5,546,282 | 8/1996 | Hill et al. ......................... 361/796 |
| 5,628,058 | 5/1997 | Hiraki ............................... 455/349 |

FOREIGN PATENT DOCUMENTS 1 690 798  5/1972  Germany.

OTHER PUBLICATIONS

Exhibit A, Photographs of a modular splitter/combiner.
"Headend Combining/Splitting Network", Cox Communications, (undated), 16 pgs.

Primary Examiner—Thanh Cong Le
Attorney, Agent, or Firm—Merchant, Gould, Smith, Edell, Welter & Schmidt, P.A.

[57] ABSTRACT

A module for radio frequency signal circuits includes an electrically conductive housing. Coax connectors are secured to the rear face of the housing. A circuit board is contained within the interior spaced between sidewalls of the housing. A ground side of the circuit board includes a layer of electrically conductive material which is electrically connected to the housing. Coax cables extend within the interior of the housing from the coax connectors and between the ground side of the circuit board and an opposing sidewall. An opposite side of the circuit board contains circuit components inner connected with one another through a plurality of circuit paths. The circuit components include an equalizer removable through the forward face of the housing to equalize an RF attenuation across a broad band.

9 Claims, 29 Drawing Sheets

RF EQUALIZER MODULE

BACKGROUND OF THE INVENTION

1. Field of the Invention

This invention pertains to circuits for broad-band RF systems. More particularly, this invention pertains to modular RF (radio frequency) circuit components.

2. Description of the Prior Art

In the telecommunications industry and more particularly in the video transmission industry, broad-band radio frequency (RF) signals (i.e., 5 MHz to 1 GHz) are carried over coax conductors from a headend to consumers. At the headend of the system, numerous signals are manipulated to achieve a wide variety of functions and objectives. For example, signals carried on numerous coax cables may be combined onto a single coax conductor. Similarly, a signal on a main coax conductor may be divided into a plurality of signals carried on branch coax conductors. Additionally, signals may be added or removed from a main conductor through directional couplers or the like.

In addition to combining, splitting, diverting or adding signals, the headend will also include apparatus for modifying signals. For example, in order to adequately tune the system, it may be desirable to provide attenuators or the like to attenuate a signal to a desired level. Further, as a broad-band RF signal is carried over a length of cable, the high frequency range of the signal may be attenuated more than a low frequency range of the signal. As a result, equalizers are utilized to modify the signal to have a level intensity throughout its frequency range.

Throughout the system, performance characteristics are critical. For example, a common performance criteria is to maintain the flatness of a signal. Flatness refers to maintaining a level intensity of a signal throughout its frequency range. For example, if the signal is attenuated by 2 dB at 1 Ghz, then it is desirable that the signal be attenuated at 2 dB at the 5 Mhz frequency. Further, the system needs to be tuned for impedance matching.

Prior art headends include a wide variety of devices to accommodate and accomplish the functions described above. It is desirable to provide an apparatus to accommodate the various functions required at the headend through a modular construction to permit ease of maintenance and cable management in a headend. Such a device must accommodate the performance characteristics of the headend while permitting the modular construction to enhance the cable management and organization of a headend.

SUMMARY OF THE INVENTION

According to a preferred embodiment of the present invention, a module is provided for containing a circuit for performing discrete functions on a radio frequency signal. The module comprises a housing of electrically conductive-material. The housing has a front face and an opposite rear face. The front face and rear face are separated by opposite sidewalls and opposite end walls. A plurality of coax connectors are secured to the rear face with an outer shield of the connectors electrically connected to the housing. A circuit board is contained within the interior. The circuit board is generally parallel to and spaced between the sidewalls. The circuit board has a component side and a ground side. The ground side includes a layer of electrically conductive material which is electrically connected to the housing. A plurality of coax cable connection locations are provided on the ground side of the circuit board. Each of the coax cable connections includes a ground connection for connecting ground shields of coax cables to the layer of electrically conductive material. The component side of the circuit board includes a plurality of circuit components interconnected with one another and with the coax cable connection locations through a plurality of circuit paths. A plurality of coax cables are disposed within the interior and connected to individual ones of the coax connectors and the coax cable connection locations. Each of the coax cables has a ground shield connected to the outer shields of the connectors and to the ground connections of the coax cable connection locations. A plurality of cables are routed for the cables to be disposed between the ground side of the circuit board and the opposing sidewall of the housing.

DESCRIPTION OF THE PREFERRED EMBODIMENT

Figure 1:
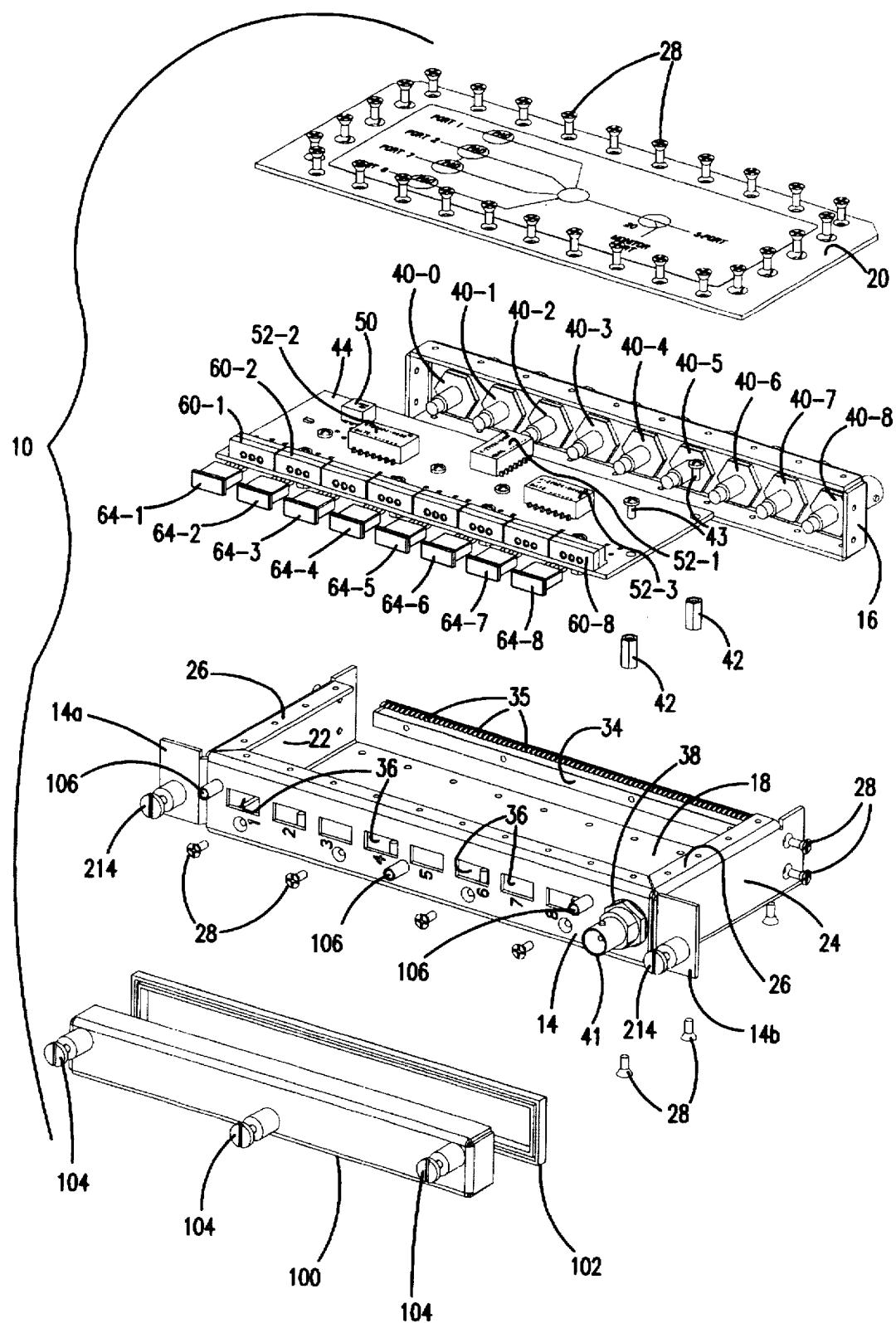
FIG. 1 is a bottom end, front face and right sidewall perspective view of one embodiment of a module according to the present invention shown in exploded view (with internal cables omitted)
Figure 2:
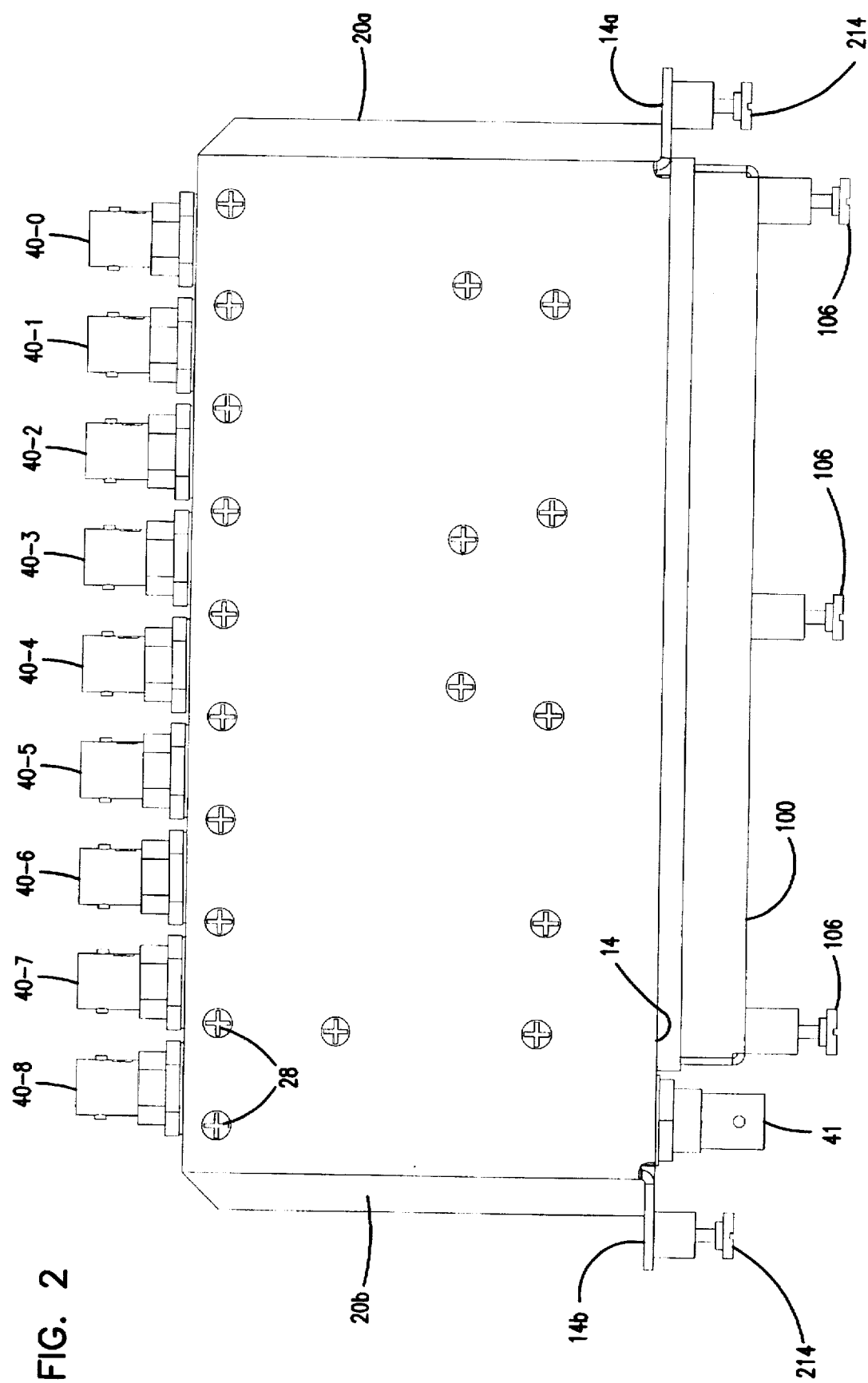
FIG. 2 is a left side plan view of the module of FIG. 1.
Figure 3:
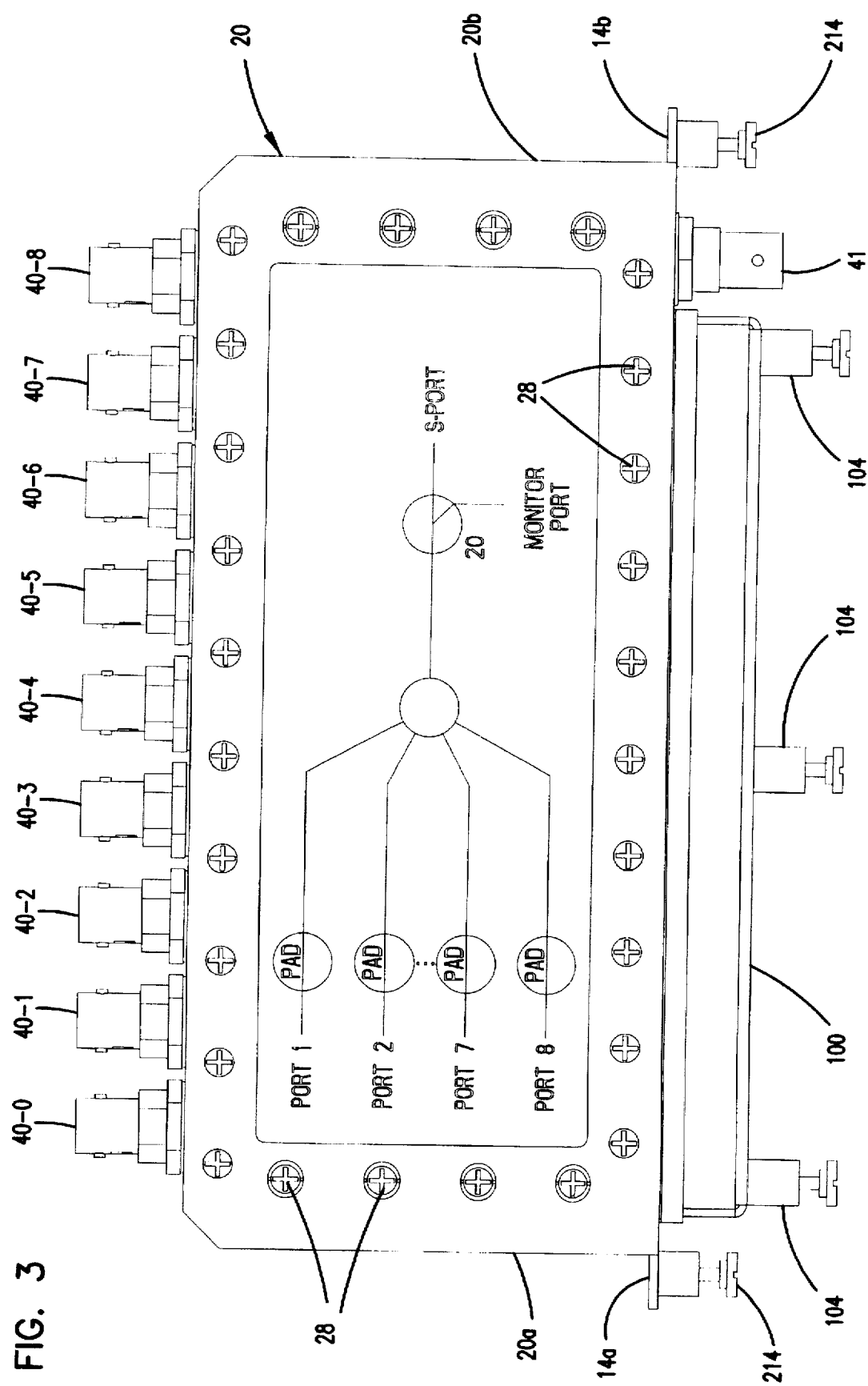
FIG. 3 is a right side plan view of the module of FIG. 1.
Figure 4:
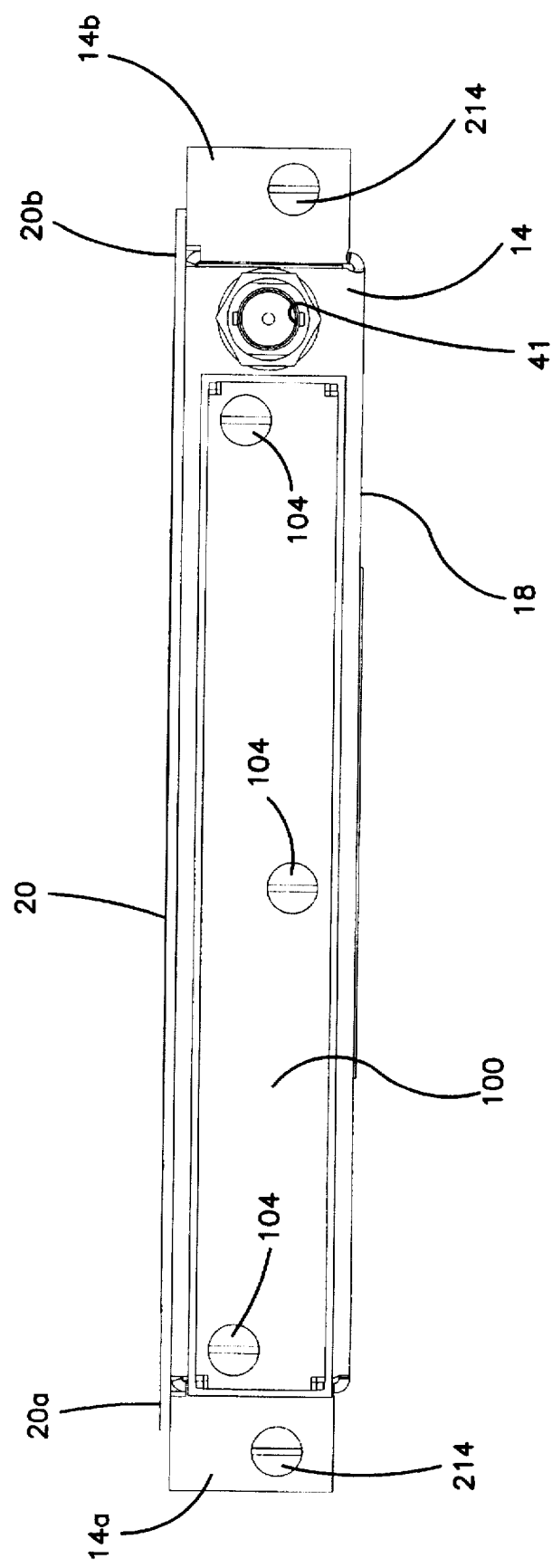
FIG. 4 is a front elevation view of the module of FIG. 1.
Figure 5:
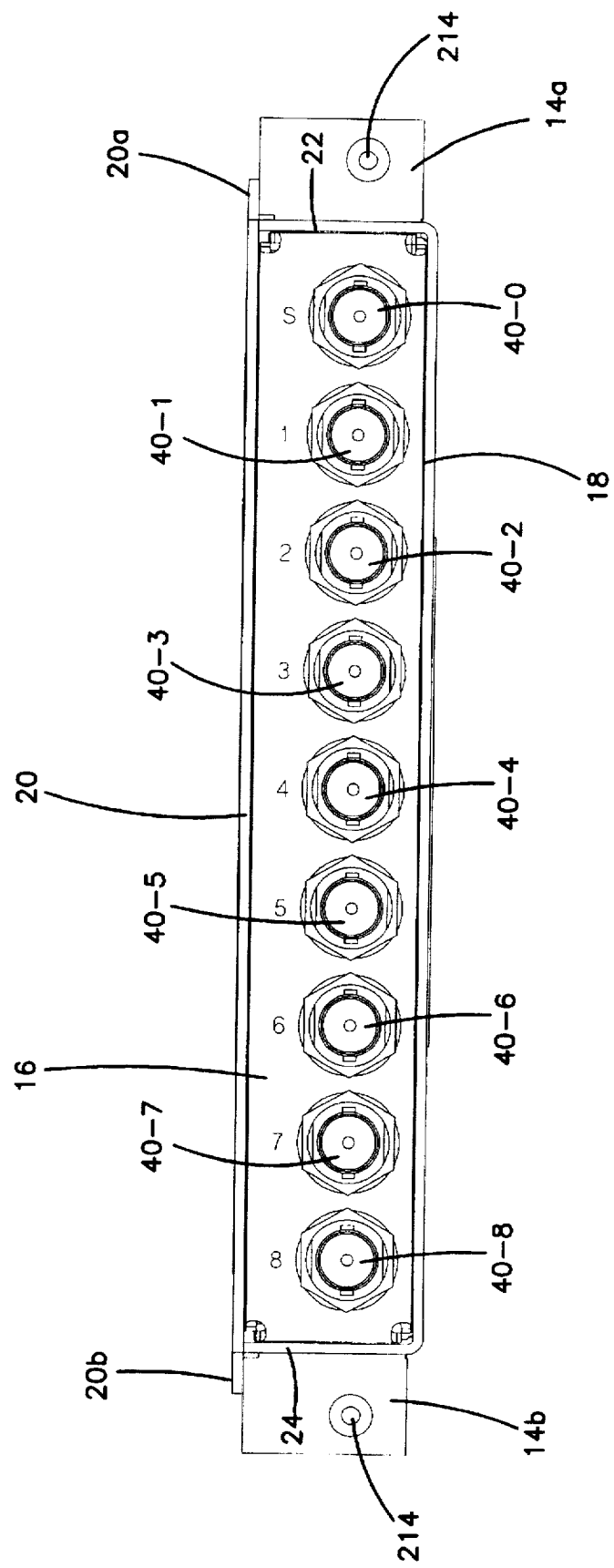
FIG. 5 is a rear elevation view of the module of FIG. 1.
Figure 6:
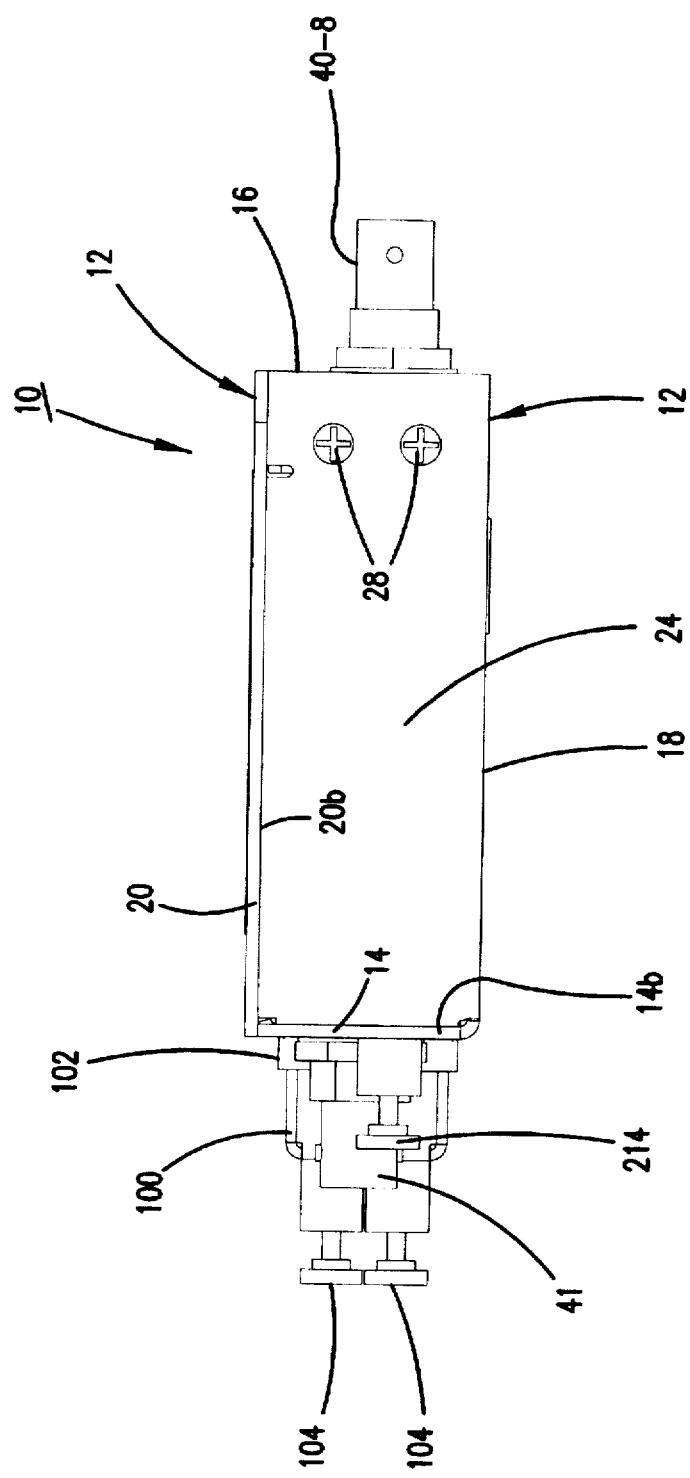
FIG. 6 is a bottom end view of the module of FIG. 1.
Figure 7:
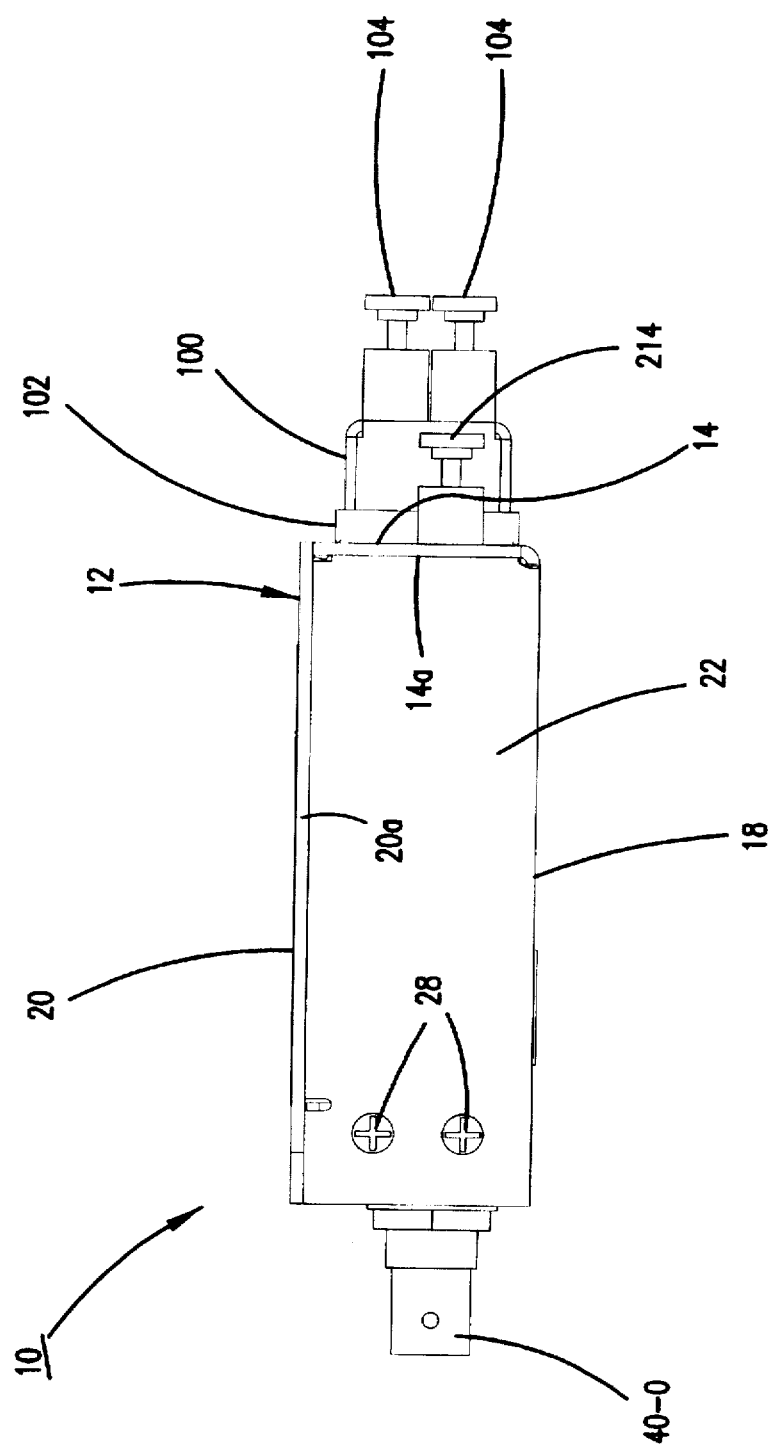
FIG. 7 is a top end view of the module of FIG. 1.
Figure 8:
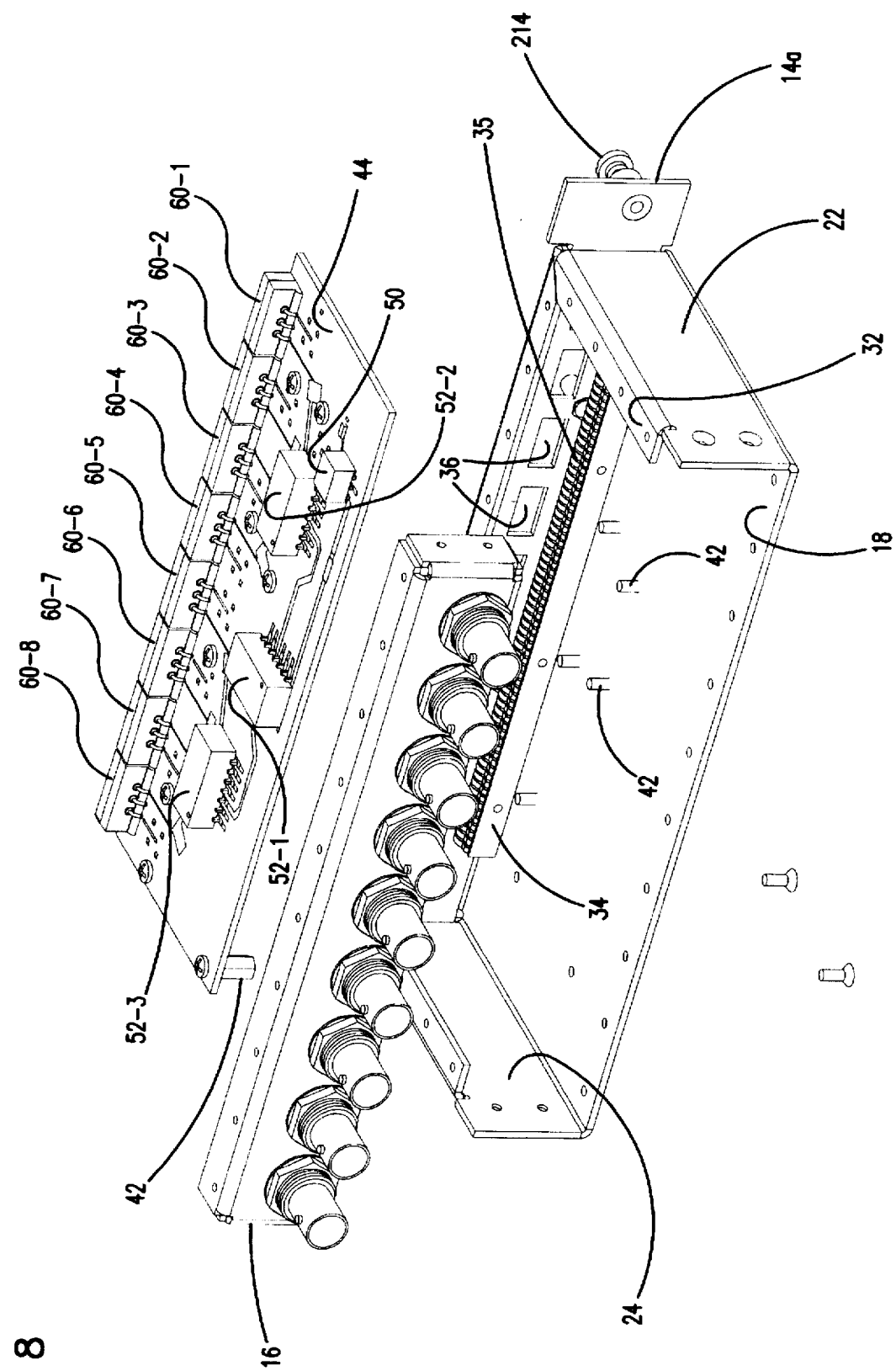
FIG. 8 is a rear, right side and top end exploded view of the module of FIG. 1 with a cover removed.

Referring now to the several drawing figures in which identical elements are numbered identically throughout, a description of the preferred embodiment of the present invention will now be provided.

With initial reference to FIGS. 1 through 11, a module 10 according to the present invention will be described for use as a splitter/combiner module for splitting a main signal into a plurality of branch signals or, alternatively, combining a plurality of branch signals into a common main signal. The module 10 includes a housing having a front face 14, a rear face 16. The front face and rear face 14, 16 are separated by opposing sidewalls 18, 20 and opposite end walls 22, 24. The housing 12 is formed of electrically conductive material. Preferably, the material is nickel-plated aluminum.

Sidewall 18 and end walls 22, 24 are integrally formed as a box configuration with walls 22, 24 having inwardly protruding peripheral ledge 26. Rear wall 16 is secured to walls 18, 22, 24 by screws 28. The sidewall 20 is fastened to the ledge 26 by a plurality of screws 28 received in aligned bolt holes of sidewall 20 and threaded bolt holes 32 on the peripheral ledge.

The sidewall 20 is sized to have a length greater than the longitudinal dimension between walls 22,24 such that ends 20a, 20b extend beyond ends 22, 24 as flanges for purposes that will be described.

The front cover 14 includes extending edges 14a, 14b which extend beyond ends 22, 24. The front cover further has an internal ledge 34 (shown in FIGS. 1, 8 and 11) on an interior surface of the cover 14. The ledge 34 is sized to extend into the interior of the housing when the front cover 14 is attached to the housing.

The front cover 14 and sidewall 20 are secured to the housing by the screws 28 received within aligned bolt holes. The screws 28 are preferably positioned at one-half inch on-center spacings to prevent EMI leakage as is conventional.

The front cover 14 includes a plurality of openings 36 the function of which will be described with the openings 36 arranged linearly along the face 14. Similarly, the front cover 14 includes an opening 38 sized to pass a coax connector 41 for purposes that will become apparent.

A plurality of coax connectors 40-0 through 40-8 are secured to the rear face 16. Each of the coax connectors is identical. Such connectors are conventional and include a central conductor surrounded by a grounded shield. The grounded shields of the coax conductors are in direct physical and electrical contact with the electrically conductive material of the rear face 16.

Contained within the interior of the housing 12 is a printed circuit board 44. The printed circuit board 44 is supported on posts 42 by screws 43. The posts 42 are electrically conductive and connected to wall 18. The printed circuit board 44 includes a component side 44a and a ground side 44b (see FIG. 9). The ground side 44b opposes the wall 18 and the component side 44a opposes wall 20. The printed circuit board 44 is maintained in parallel, spaced relation between the walls 18, 20 by supports 42.

A layer 44c (FIG. 9) of electrically conductive material (such as a sheet layer of copper) is provided on the exterior surface of surface 44b.

A plurality of coax cable connection locations 48-0 through 48-8 are provided on the ground side 44b of the printed circuit board 44. Each of the coax cable connection locations 48-0 through 48-8 include a ground connection for connecting the ground shields of a coax cable to the conductive layer 44c.

A plurality of circuit components are disposed on the component side 44a of the printed circuit board 44. In the embodiment shown, the components include a solid state directional coupler 50 and three solid state splitter/combiners 52-1, 52-2 and 52-3.

It will be appreciated that a solid state directional coupler 50 is a commercially available item, and an example of such is a 20 dB coupler Product No. CPL/20BE-08A3 sold by TRAK Microwave, 4726 Eisenhower Blvd., Tampa, Fla. 33634-6391. Similarly, solid state splitter/combiners 52-2 through 52-3 are commercially available one-by-four splitters and examples of such are Product No. SPL/4BE-53D sold by TRAK Microwave. Splitter/combiner 52-1 is a one-by-two splitter such as Product No. SPL/2BE-53D of TRAK Microwave.

The splitter/combiners each receive a signal and divide an RF signal into two signals of equal strength. Splitter/combiners 52-2 and 52-1 are electrically connected in series. Similarly, splitter 52-3 is connected in series with splitter 52-1 such that splitter 52-3 is connected in parallel to splitter 52-2.

Figure 9:
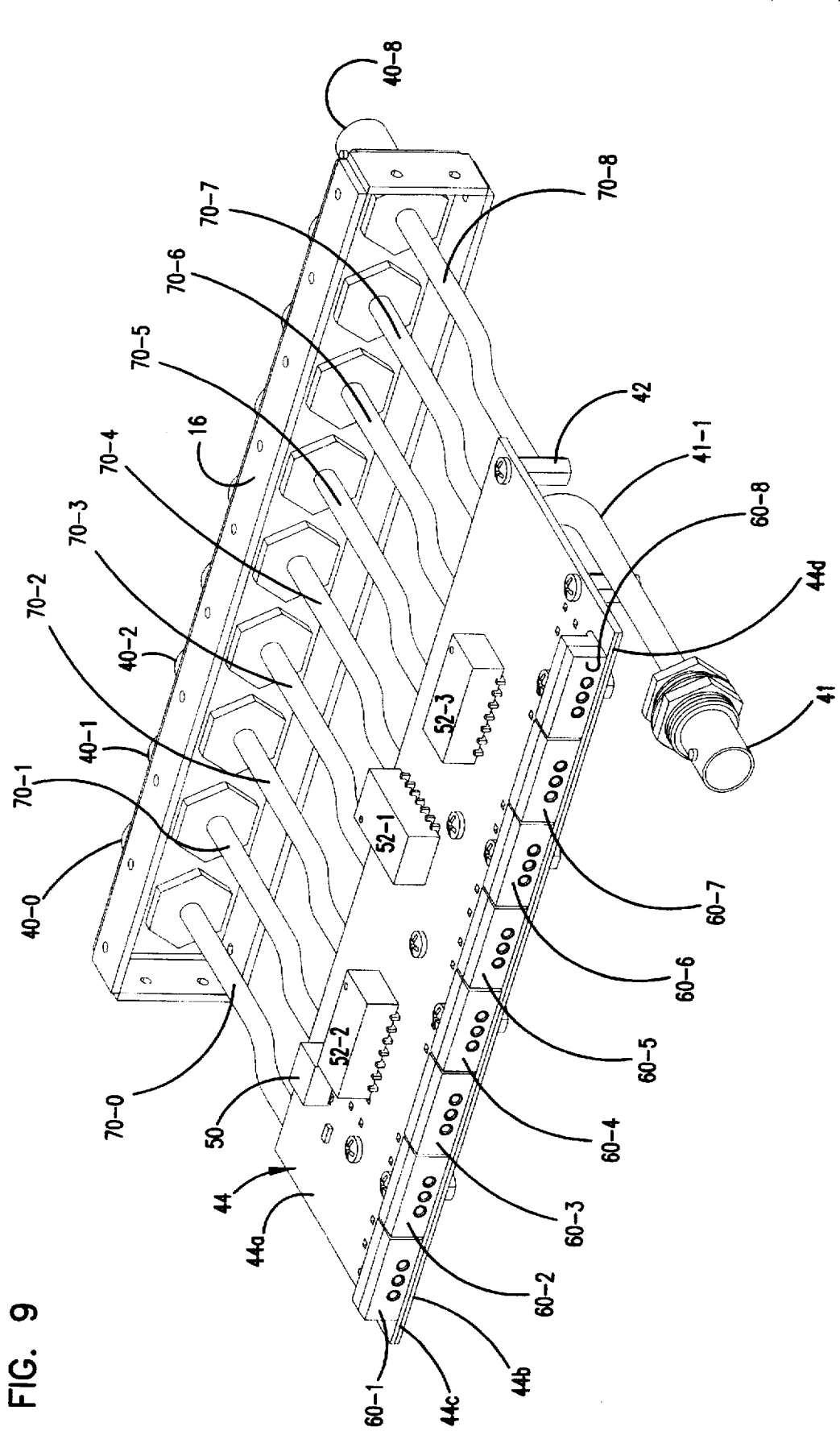
FIG. 9 is a perspective view of internal components of the module of FIG. 1.
Figure 9A:
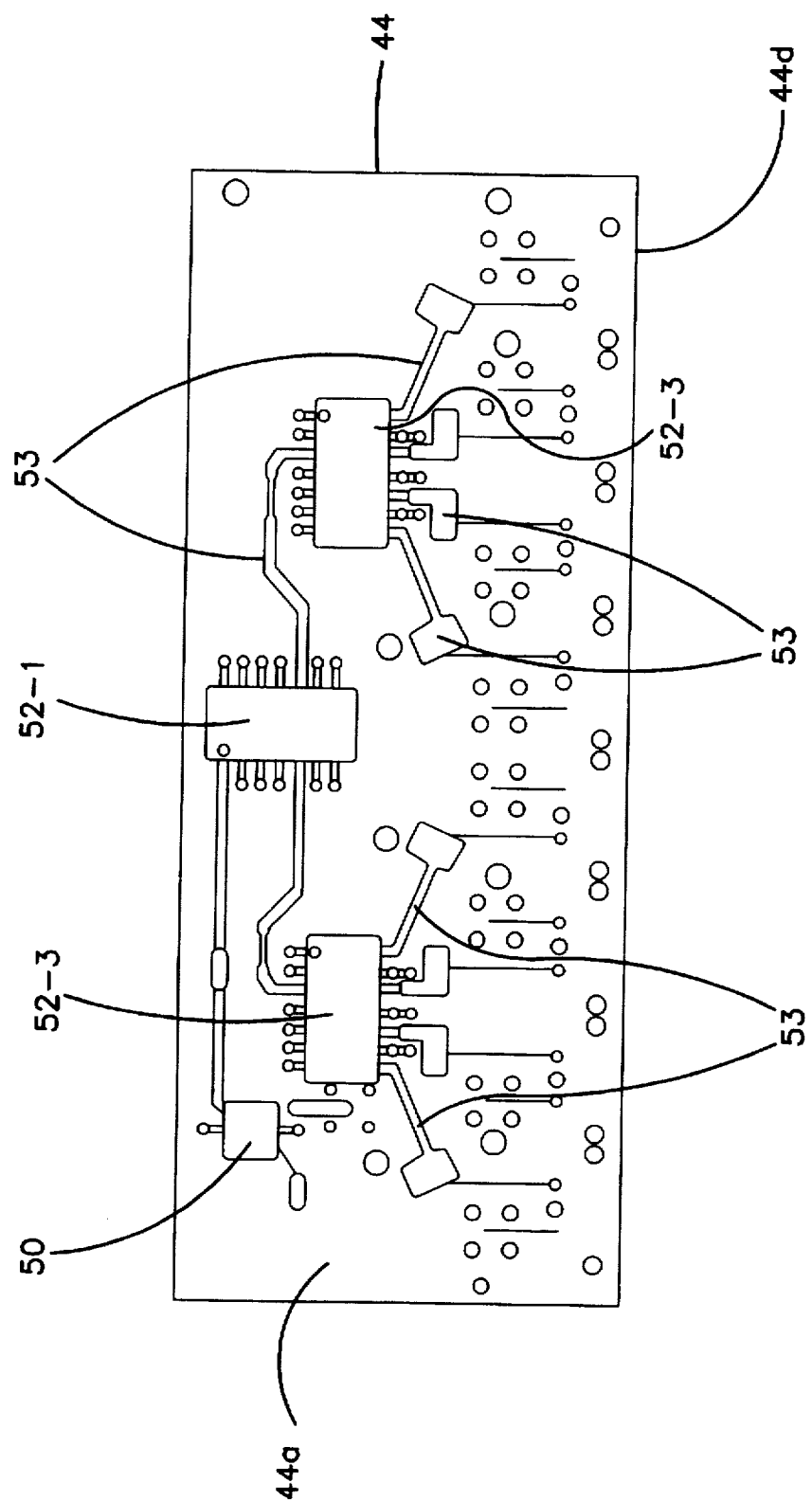
FIG. 9A is a top plan view of a printed circuit board and attached components.
Figure 10:
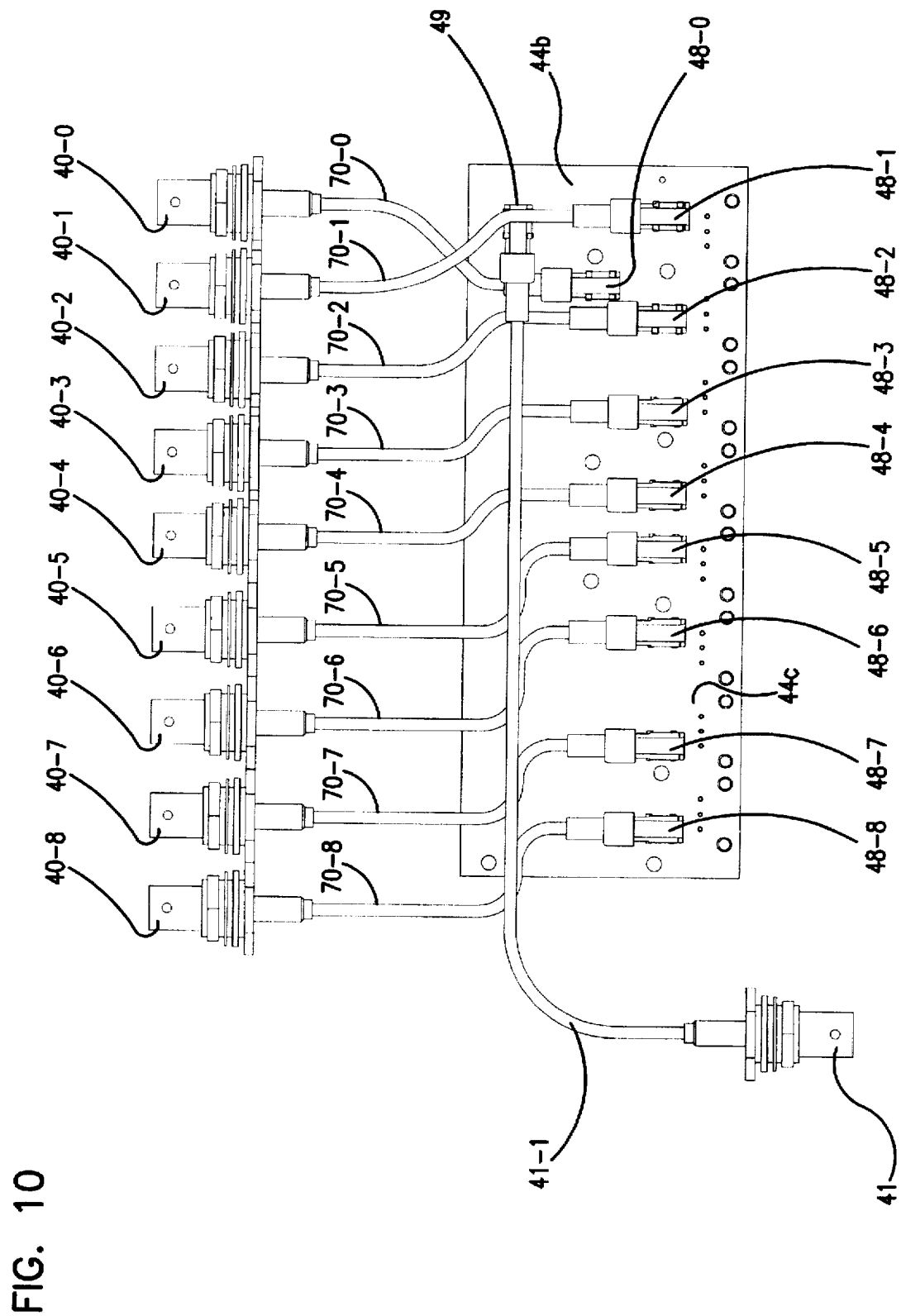
FIG. 10 is an opposite side plan view of the components of FIG. 9.
Figure 11:
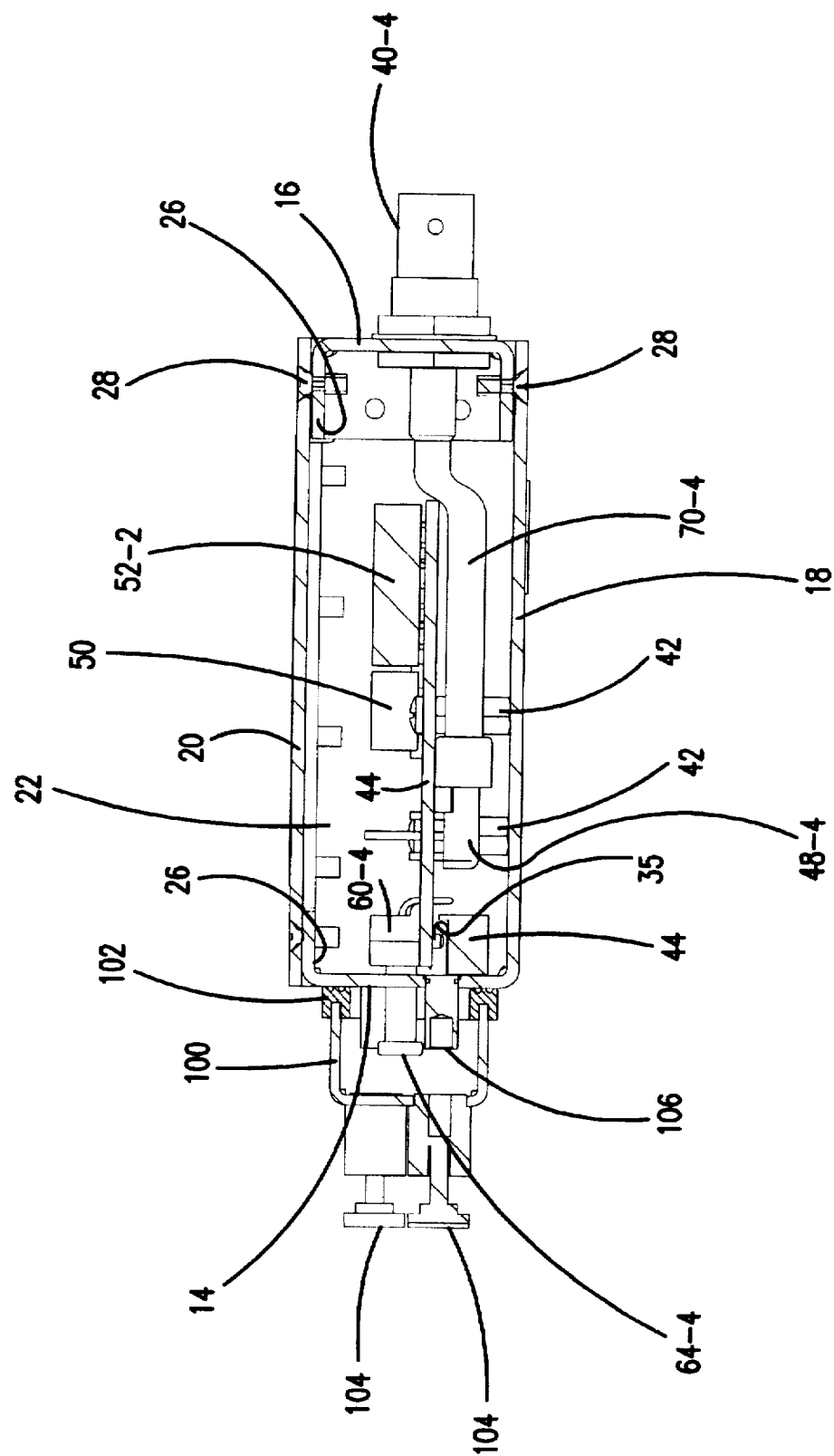
FIG. 11 is a side cross-sectional view of the module of FIG. 1.

The electrical connection of the components 50 and 52-1 through 52-3 is provided through a plurality of circuit paths 53 (FIG. 9A) contained on the surface 44a where the circuit paths connect the components 50, 52-1 and 52-3 with the coax connection locations 48-0 through 48-8. The circuit paths connect the components and the connection locations such that connector 40-0 is connected to the directional coupler 50 with a portion of the signal diverted from the directional coupler 50 to the coax monitor connector 41 through cable 41-1. Preferably, coupler 50 provides a −20 dB monitor signal.

The main signal from the directional coupler 50 is passed to the splitter/combiner 52-1 which divides the main signal into two signals with one passed along the circuit paths to splitter/combiner 52-2 and the other passed to splitter/combiner 52-3. Each of splitters 52-2 and 52-3 split a signal into four signals resulting in a total of eight branch signals passed to connection locations 48-1 through 48-8.

In the preceding paragraph, a signal is described as coming into the directional coupler from connector 40-0 and then eventually split and passed to connectors 40-1 through 40-8. With the directional coupler 50 arranged in the schematic shown of FIG. 3, such a signal flow path would result in losing a monitor function at monitor port 41. With this schematic shown in FIG. 3, signals passed into connectors 40-1 through 40-8 are attenuated and combined to a main signal which is then passed through directional coupler 50 to OUT port 40-0. A portion of the main signal is then passed from the directional coupler 50 to the monitor port 41 so that the signal may be monitored. If it is desirable to pass a signal into connector 40-1 for division into branch signals distributed to connectors 40-1 through 40-8, a different directional coupler 50 can be provided such that a signal from connector 40-0 can be monitored at port 41.

Before the branch signals are passed to the connection locations, they are passed through attenuator components. Each of the attenuator components is identical and includes a base member 60-1 through 60-8 which is secured to the component side 44a of the printed circuit board 44 along a leading edge 44d of the printed circuit board 44 and with the base members 60-1 through 60-8 arranged in a linear array.

A plurality of the attenuator plugs 64-1 through 64-8 are provided to be releasably connected to individual ones of the base member 60-1 through 60-8. The attenuator plugs 64-1 through 64-8 provide an attenuation to each of the branch signals being sent to connectors 40-1 through connectors 40-8.

Attenuator plugs and base members are commercially available items such as those sold as Product No. F-7520-A (for a 20 dB attenuator) through Communication Associates 1750 T-'Coleman Road, Anniston, Ala. 36207. The plugs 64-1–64-8 can be individually selected to provide a discrete amount of attenuation to a signal. For example, a "zero" plug can be inserted into a base member to provide 0 dB attenuation. Alternatively, at an option of a technician, the 0 dB plug may be replaced with a 15 dB plug to provide 15 dB attenuation to a signal. As a result, each of the branch circuits can be individually provided with a unique attenuation selected at an option of a technician. The holes 36 on the front face 14 are arranged and sized such that each of the attenuator plugs extends through individual ones of the holes 36 to be grasped by an operator. As a result, an operator can remove and replace an attenuator plug without needing access to the interior of the housing 12.

To provide EMI leakage protection, the front face 14 is provided with a removable cover 100 surrounding the array of holes 36. A deformable, conductive seal 102 (silicon gasket impregnated with silver particles) is provided between the cover 100 and face 14. Threaded connections 104 on the cover 100 are aligned with threaded holes on the standoff posts 106 such that the cover 100 can be secured to the face 14 by turning the threaded connectors 104 into the standoff posts 106. As the threaded connection 104 is tightened, the edge of the cover 100 compresses into the seal 102 to thereby compress the seal 102 against the face 14 to provide an effective EMI seal.

The device thus described performs splitter/combiner functions with connector 40-0 being a main connector and with connectors 40-1 through 40-8 being branch connectors. In other words, a signal admitted to connector 40-0 is split into eight equal signals passed to connectors 40-1 through 40-8. Further, the main signal may be monitored through forward connector 41.

As shown in the drawings, all of the connectors 40-0–40-8 are connected to the connection locations 48-0–48-8 via coaxial cables 70-0 through 70-8 such that the ground shield of the coaxial cable is electrically connected to the ground shield of the connectors 40-0 through 40-8, respectively, as well as connected to the conductive layer 44c.

In RF circuits, impedance matching is critical. The parallel relation of the electrically conductive layer 44c to the sidewall 18 of the housing 12 presents a small capacitance. Further, the spaced relation of the circuit paths 53 to the opposite sidewall 20 presents a minute capacitance. Capacitance between the housing and the circuit components are referred to as "parasitic reactance". Further, there is natural capacitance or reactance of components on the circuit board 44. The pathways 53 are tuned to balance the capacitance. The pathways 53 are tuned by adjusting the size of the circuit pathways 53 such that they present an inductance selected to balance the parasitic reactances and the circuit board reactances. It will be appreciated that sizing circuit pathways to present a desired impedance is well known in the art. Also, the cables 70-0 through 70-8 are routed between the ground surface 44c of the circuit board 44 and its opposing sidewall 18 of the housing 12. By routing the cables 70-8, 70-8 on this side of the circuit board 44 and avoiding placing the cables adjacent any of the circuit components or circuit pathways, undesirable reactances are avoided.

With the structure thus described, the desired circuit function is attained in a modular format. Further, in addition to impedance matching circuit components, the selection and arrangement of components permits a high performance module with impedance matching throughout and with desired flatness of a signal across the broad band frequency range.

As shown in the drawings, the forward ledge 34 includes a plurality of resilient spring contacts 35 mounted on the ledge 34 and positioned to swipe against the electrically conductive layer 44c as the cover 14 is placed on to the housing to insure enhanced electrical contact between the conductive layer 44c and the cover 14 so that all elements are grounded when coaxial cables are connected to the rear connectors.

To further protect the signal, the front cover 100 is provided on front end 14 to cover and enclosed all attenuator plugs 64-1–64-8 extending through holes 36. The cover 100 prevents EMI interference which would otherwise occur by uncovered plugs 64 extending through holes 36.

The foregoing discussion with respect to FIGS. 1–11 described an embodiment of the present invention for an RF module having splitter functions and monitor functions. FIGS. 12–18 illustrate the invention in a different embodiment for an equalizer circuit. In an equalizer circuit, an equalizer component is used to provide the same degree of attenuation at the extremes of the RF bandwidth. Elements similarly numbered with respect to the previously described embodiment are numbered similar in FIGS. 12–18 with the addition of an apostrophe to distinguish between the embodiments.

Figure 12:
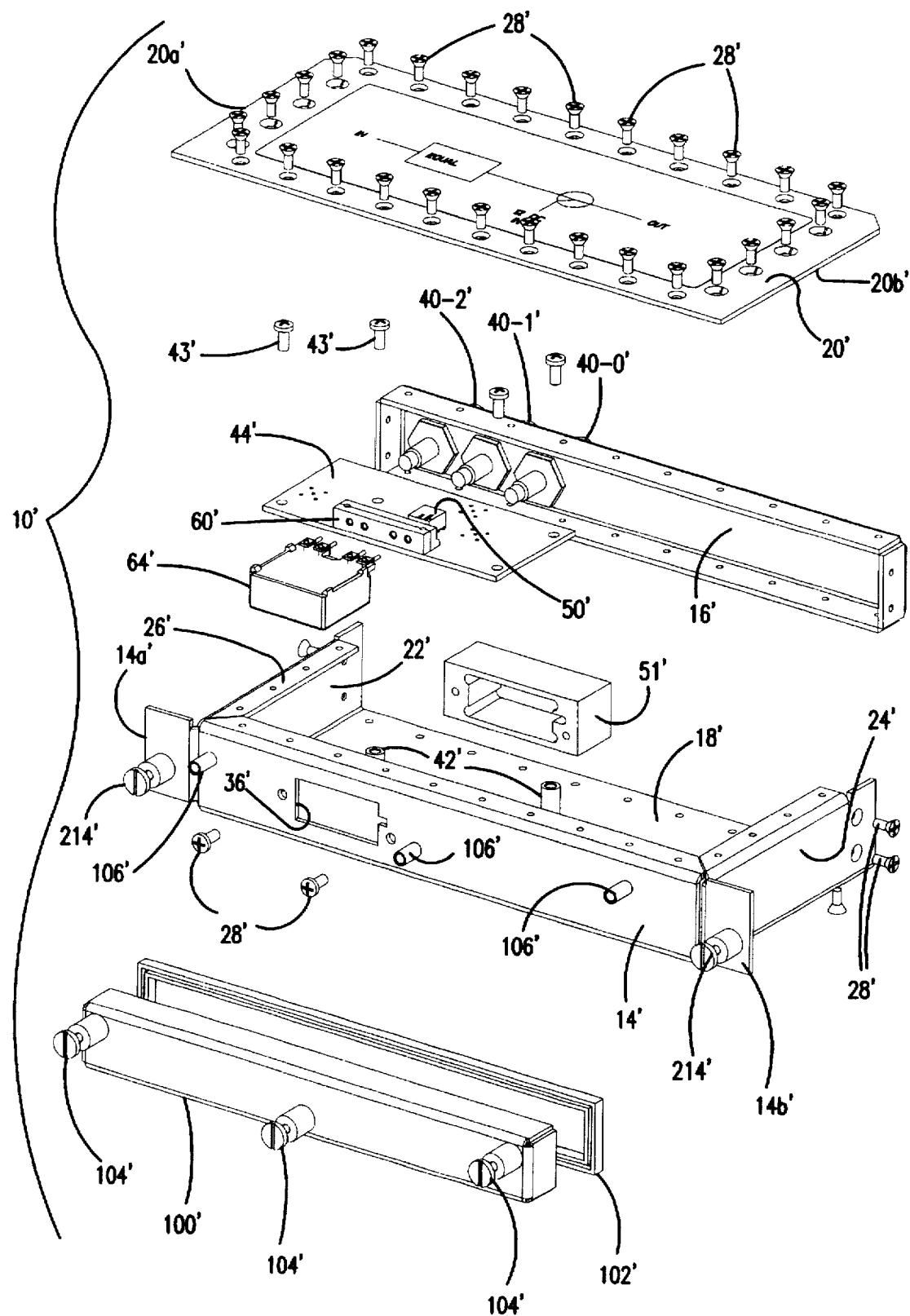
FIG. 12 is a view similar to that of FIG. 1 showing in exploded format an alternative embodiment of the present invention.
Figure 13:
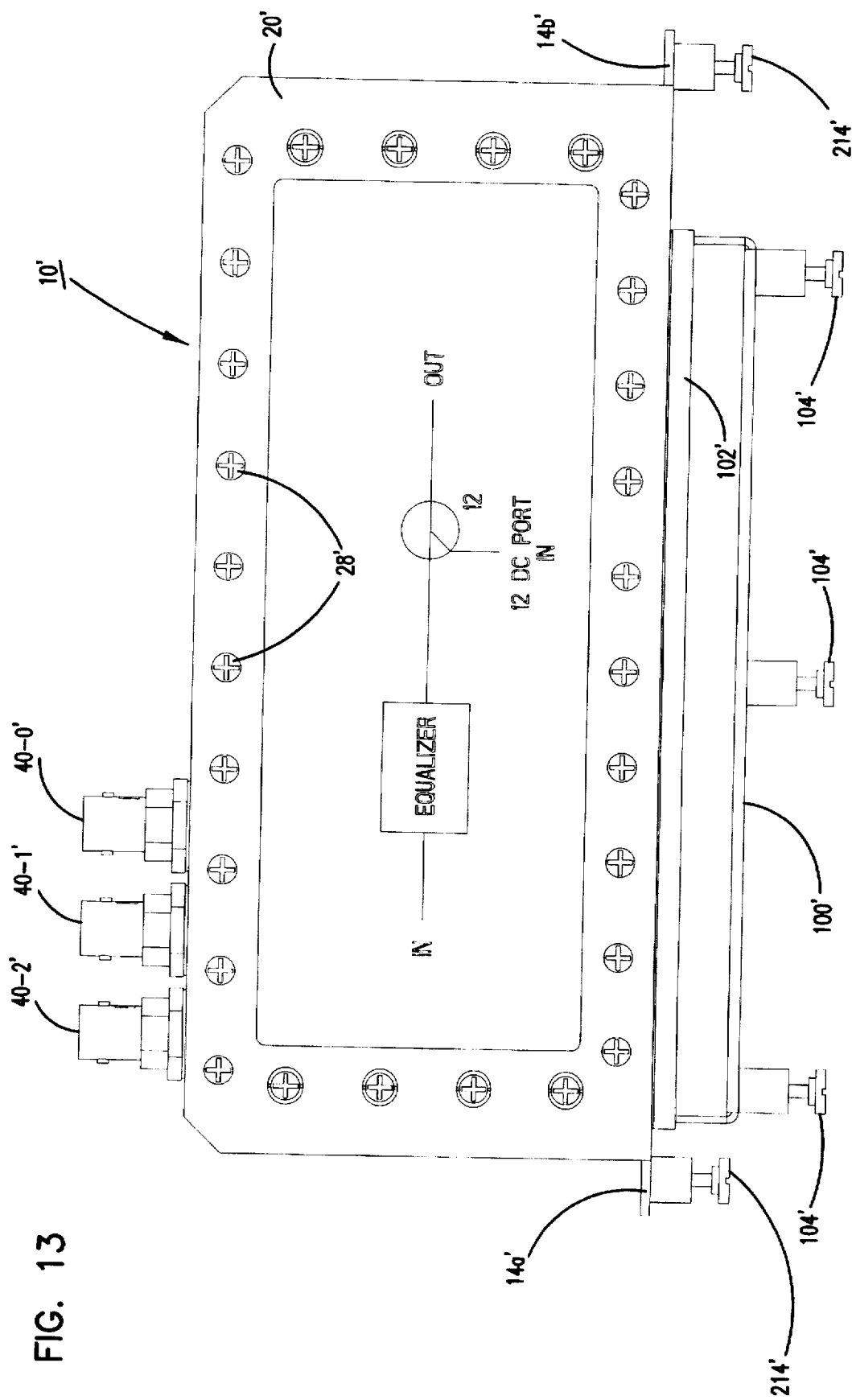
FIG. 13 is a right side plan view of the module of FIG. 12.
Figure 14:
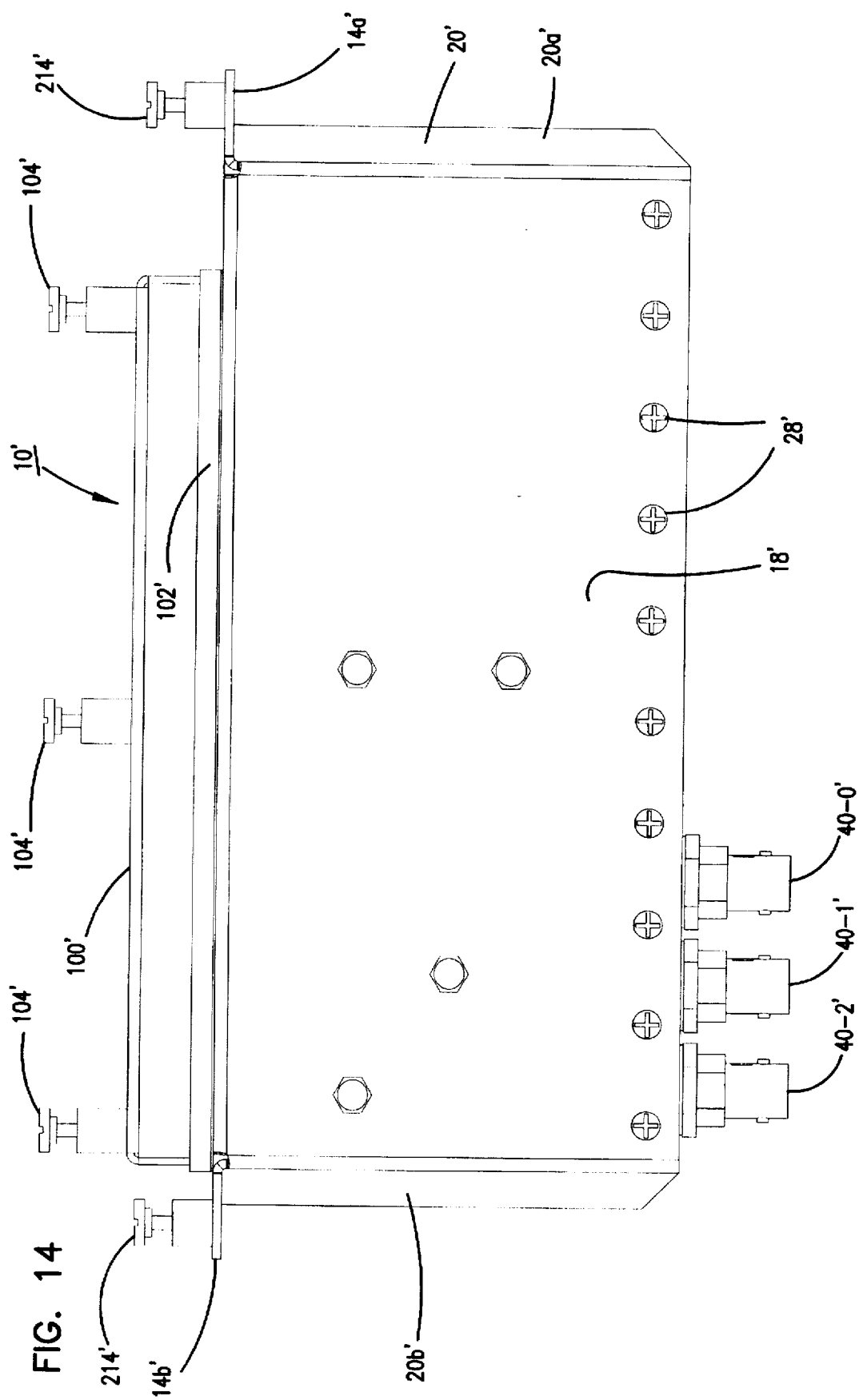
FIG. 14 is a left side plan view of the module of FIG. 12.
Figure 15:
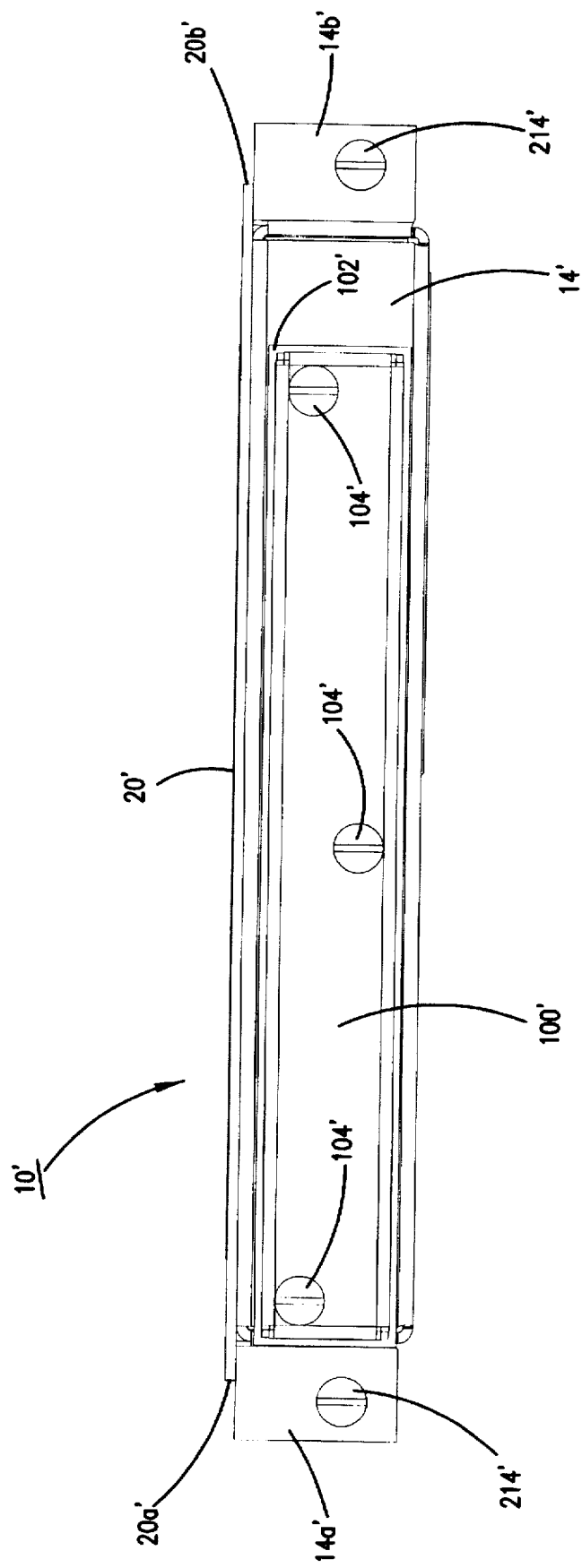
FIG. 15 is a front elevation view of the module of FIG. 12.
Figure 16:
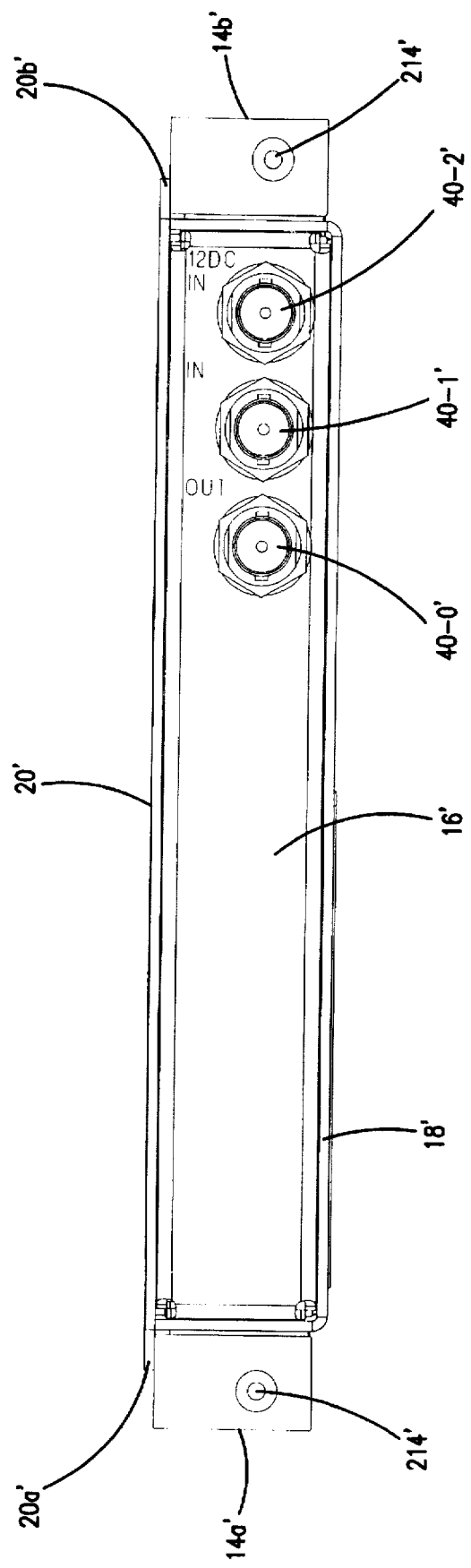
FIG. 16 is a rear elevation view of the module of FIG. 12.
Figure 17:
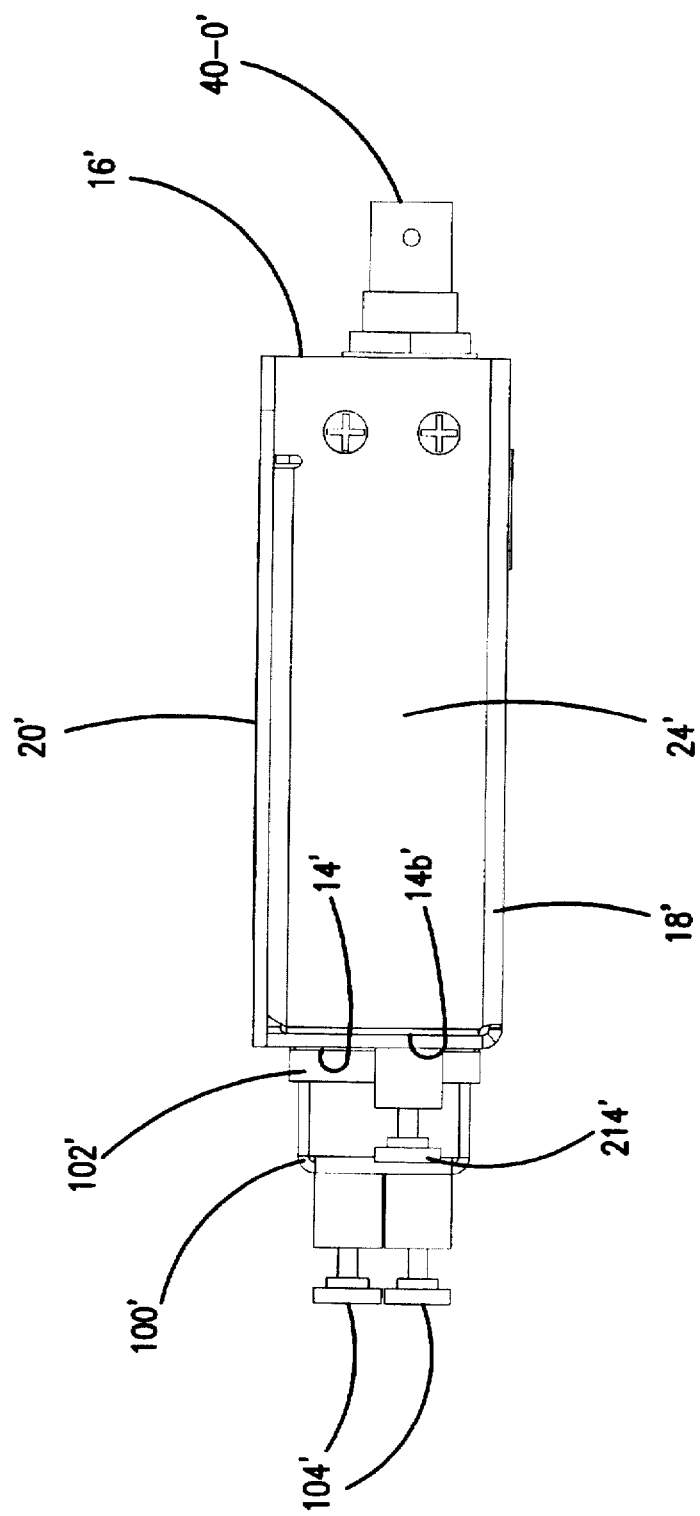
FIG. 17 is a bottom end view of the module of FIG. 12.
Figure 18:
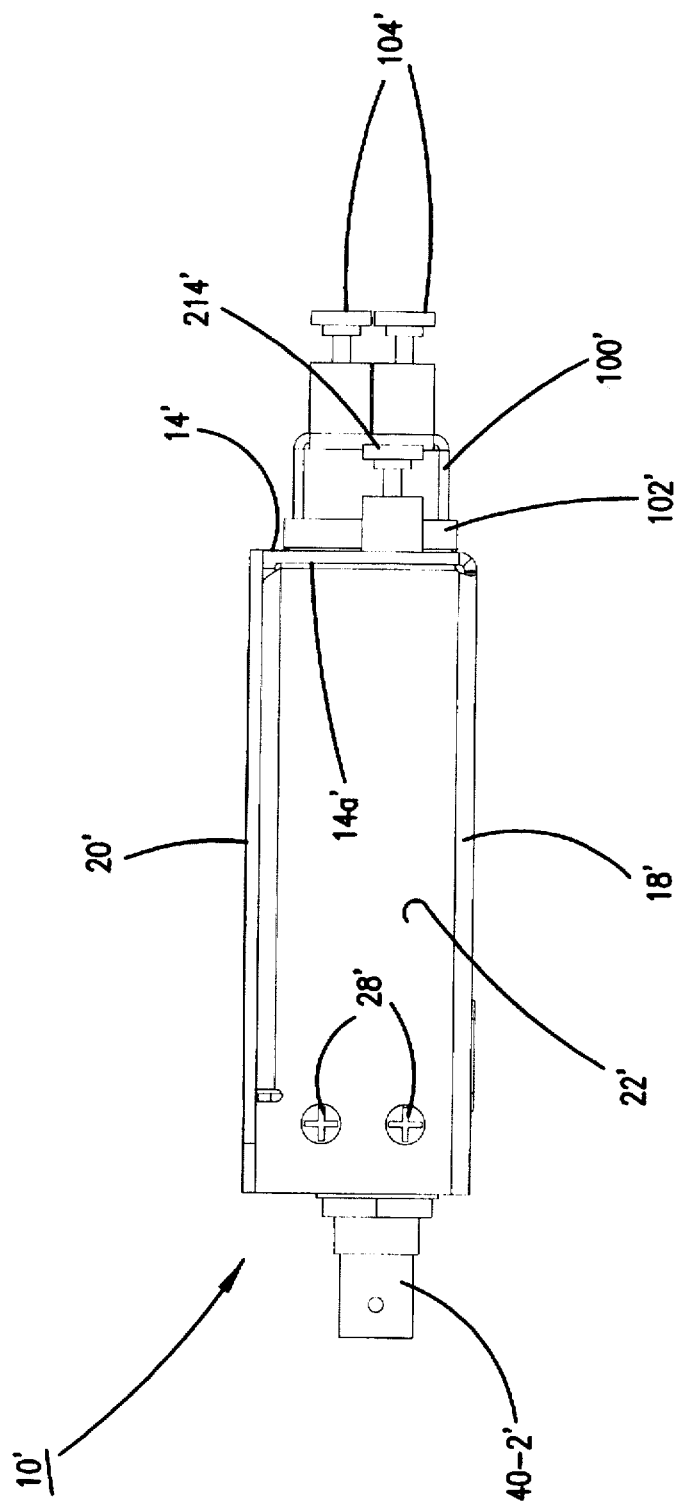
FIG. 18 is a top end view of the module of FIG. 12.
Figure 19:
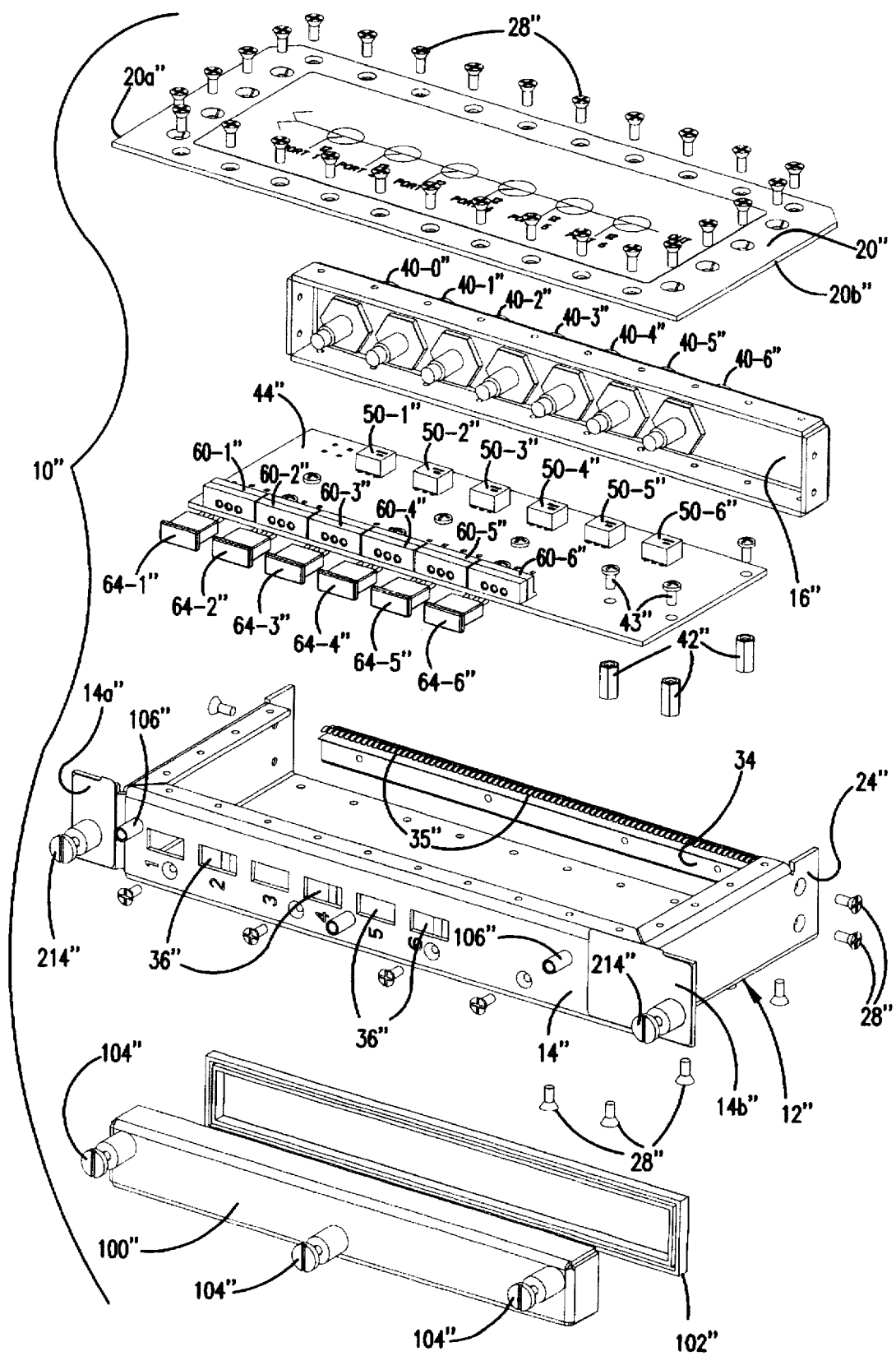
FIG. 19 is a bottom end, front face and right sidewall perspective view of a third embodiment of a module according to the present invention shown in exploded view (with internal cables omitted)
Figure 20:
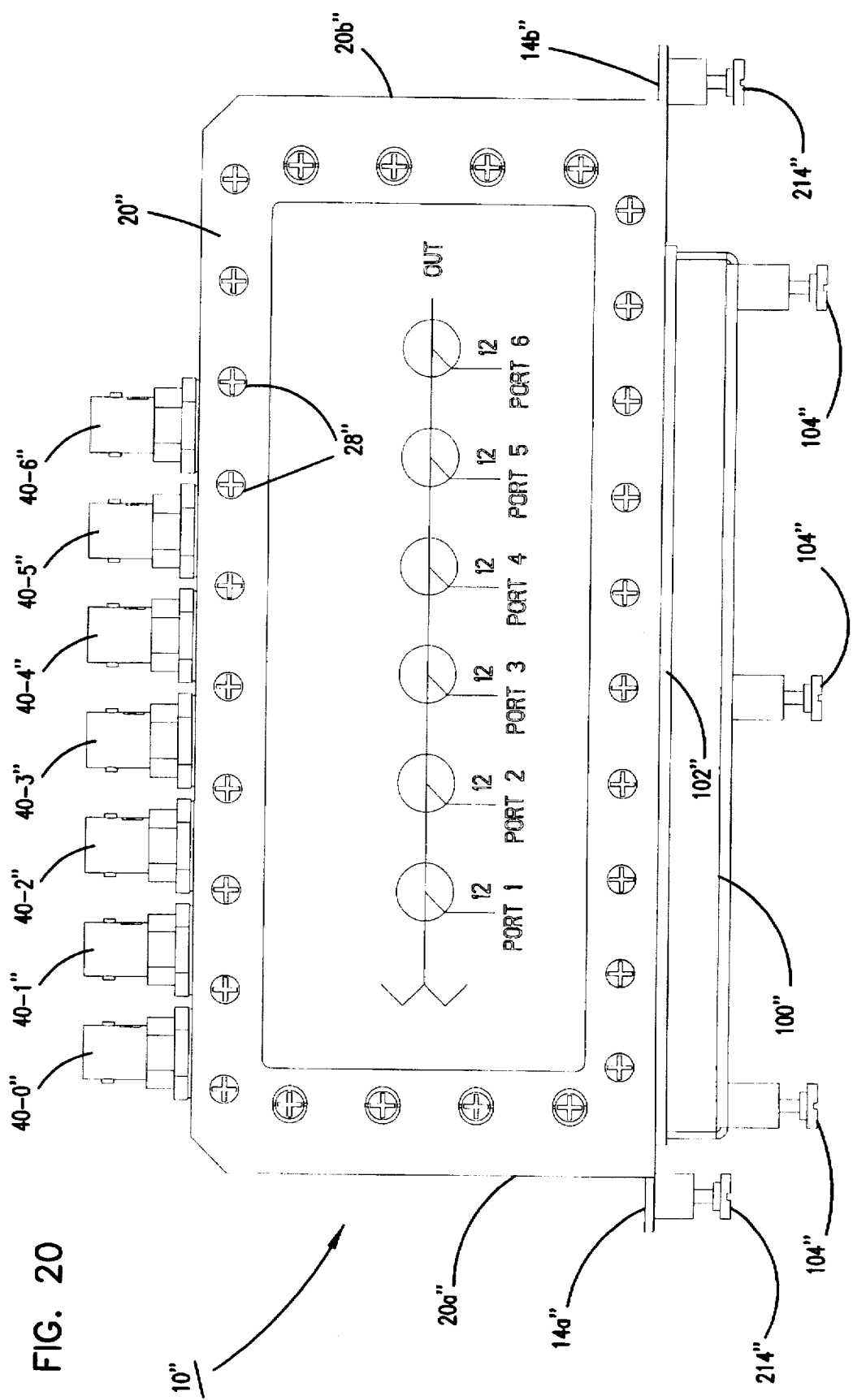
FIG. 20 is a right side plan view of the module of FIG. 19.
Figure 21:
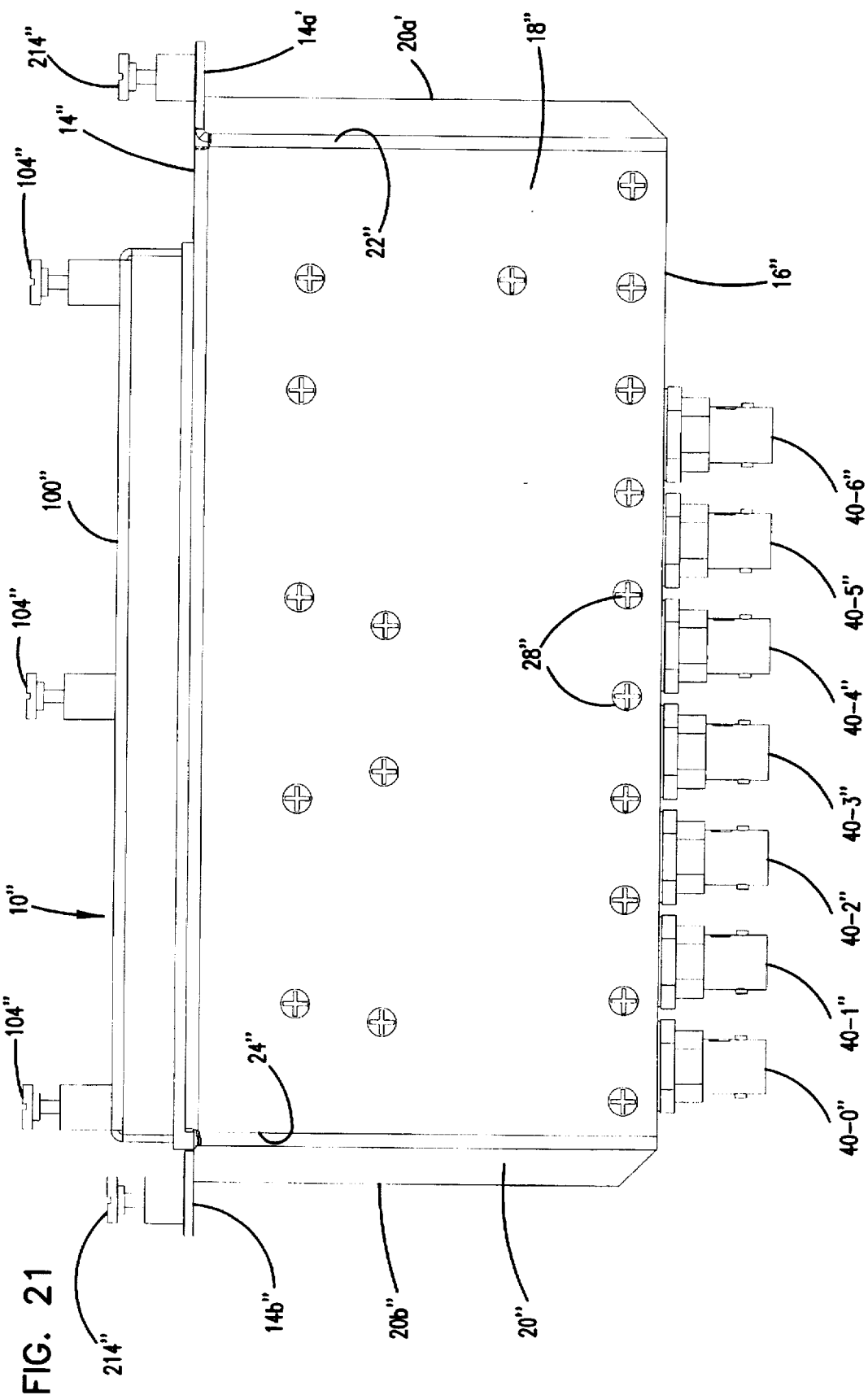
FIG. 21 is a left side plan view of the module of FIG. 19.
Figure 22:
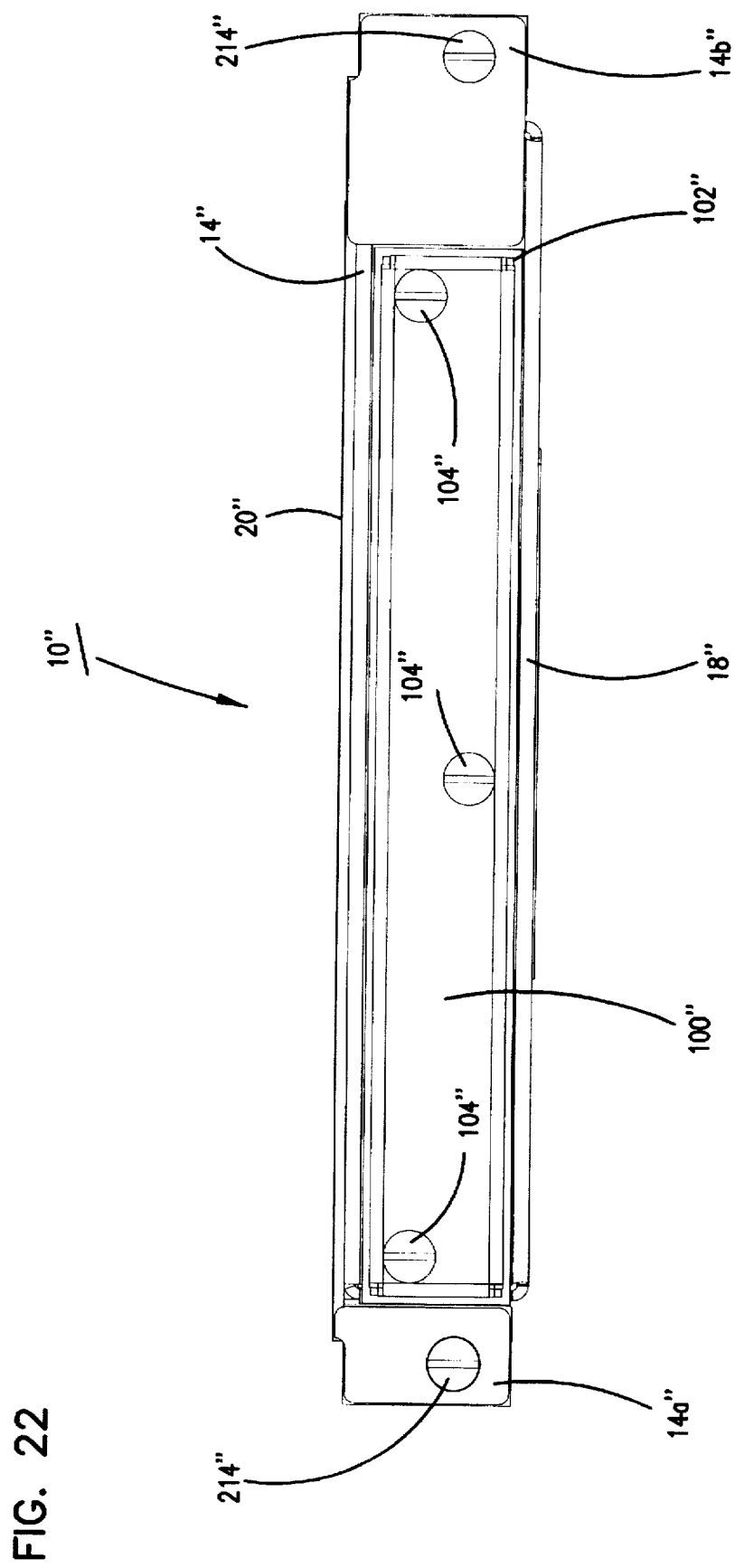
FIG. 22 is a front elevation view of the module of FIG. 19.
Figure 23:
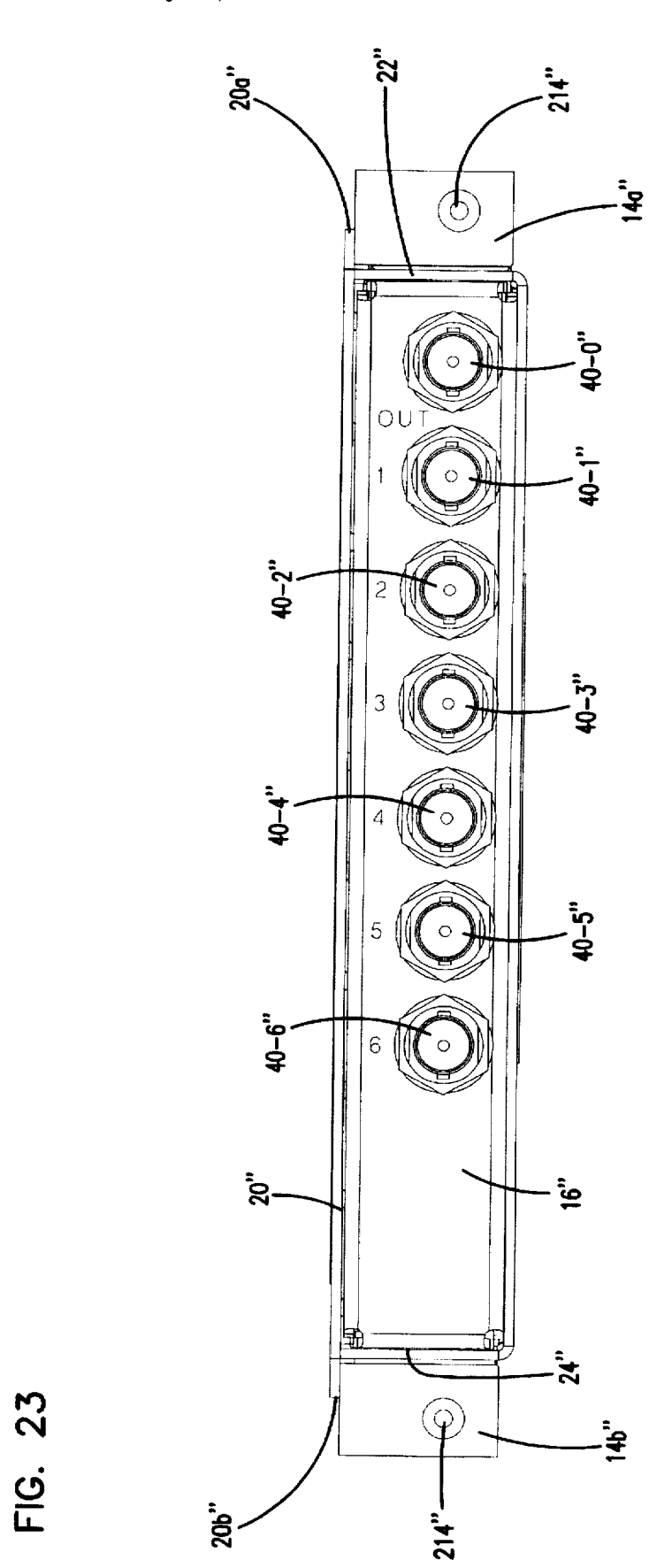
FIG. 23 is a rear elevation view of the module of FIG. 19.
Figure 24:
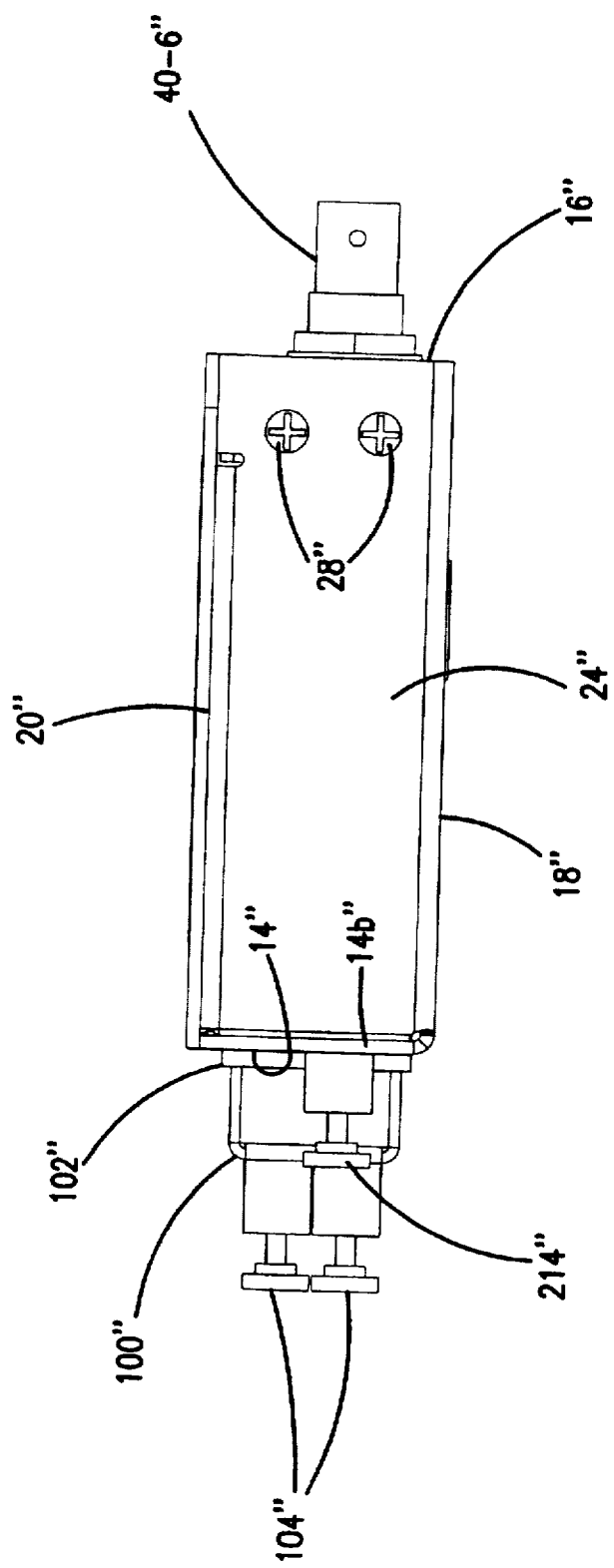
FIG. 24 is a bottom end view of the module of FIG. 19.
Figure 25:
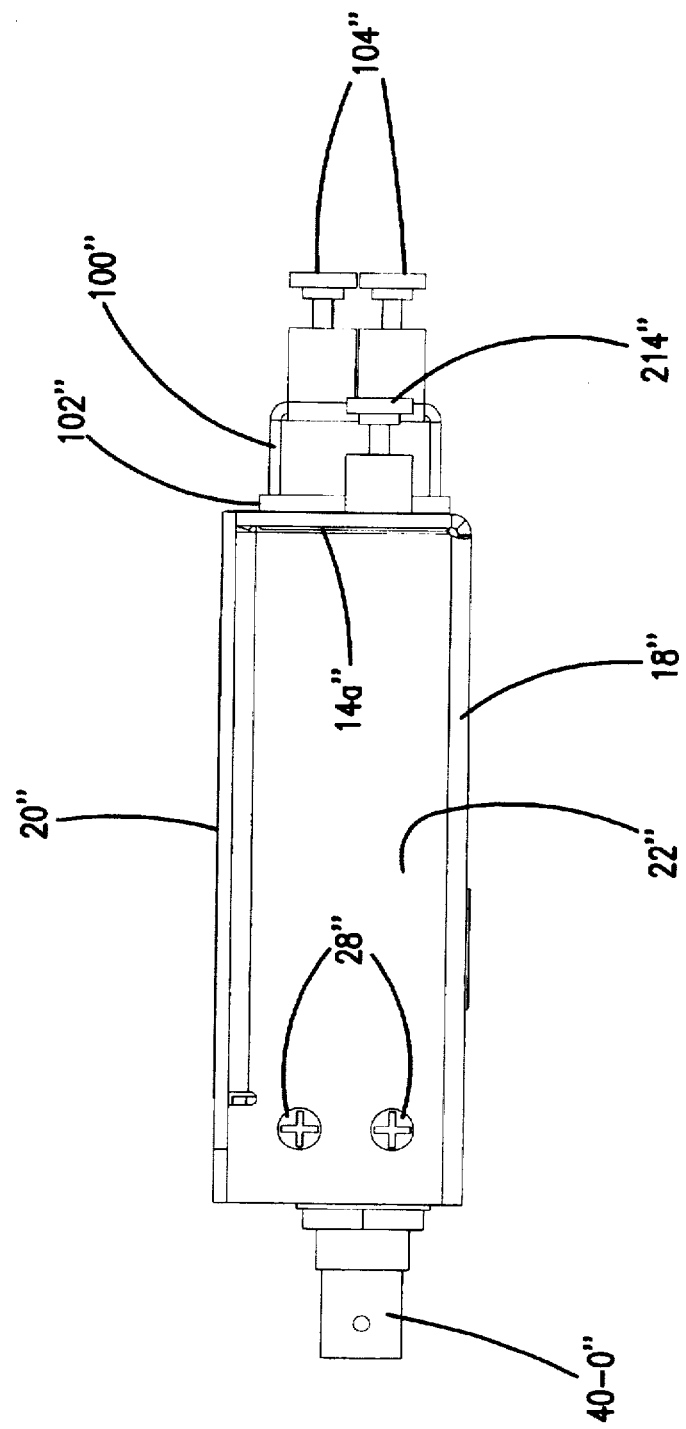
FIG. 25 is a top end view of the module of FIG. 19.

In FIG. 12, a module 10' includes a housing having a base 18' and end walls 22', 24'. The module 10' further includes a front face 14' and a rear face 16'. A side cover 20' closes the module 10'.

As in the previously described embodiment, the present invention incorporates a printed circuit board 44' containing circuit components. The circuit board 44' is maintained in parallel spaced relation between the sidewall 20' and the lower sidewall 18' by support posts 42' and associated screws 43'.

For the equalizer circuit, the circuit components include a directional coupler 50' and an equalizer component 64' removably secured to a base member 60'. The equalizer 64' may be removed or replaced through an opening 36' in the forward wall 14'.

The rear wall 16' contains coax connectors 40-0', 40-1' and 40-2'. Coaxial cables (not shown) extend from the coax connectors 40-0' through 40-2' and beneath the printed circuit board 44' in a manner identical with that previously described. Further, as in the previous embodiment, the circuit board 44' contains an electrically conductive layer opposing and electrically connected to surface 18'. Also, the circuit paths on the upper surface of the board 44' are provided to balance impedances as previously described.

The coaxial cables will extend between the board 44' and the surface 18' for reasons previously discussed. The circuit paths on the board 44' are disposed such that an incoming signal from 40-0' is passed to the equalizer and then to the directional coupler 50'. Further, the separate incoming signal can be passed from connector 40-1' to directional coupler 50' encoupled with the signal from the equalizer 64' with the coupled signal passed to the output connector 40-2'. A support 51' is mounted within the interior of the housing to guide equalizer 64' toward base member 60' in required alignment. As with the previous embodiment, a cover 100' covers the front face 14' together with a gasket 102' to prevent EMI.

All other features of the module 10' are similar to the module 10 including the external dimensions and tabs of the module such that a module 10' may be interchangeable in a chassis with a module 10. Further, the module 10' has the same impedance matching and parasitic reactance compensation previously mentioned with respect to module 10. As a result, the invention of module 10 is incorporated into module 10' with module 10' showing a specific embodiment of the invention for use with an equalizer component. It will be appreciated that equalizer components 64' are commercially available items. An example of such is product number G75-000 of ADC Broadband Communications Division, 999 Research Parkway, Meridan, Conn. 06450.

FIGS. 19–25 illustrate a third embodiment of the present invention for use in a 6-port directional coupler. The directional couplers are used to split or add multiple signals. Elements similarly numbered with respect to the previously described embodiments are numbered similarly in FIGS. 19–25 with the addition of a double apostrophe to distinguish between the embodiments.

In FIGS. 19–25, a module 10" includes a housing 12" having a base 18" and end walls 22", 24". The module 10" further includes a front face 14" and a rear face 16". A side cover 20" closes the module 10".

As in the previously described embodiments, the present invention incorporates a printed circuit board 44" containing circuit components. The printed circuit board 44" is maintained in parallel spaced relation between the sidewall 20" and the lower sidewall 18" by support post 42" and associated screws 43".

The circuit components include six directional couplers 50-1" through 50-6", each with individually associated attenuator plugs 64-1" through 64-6" which are removably secured to individual base members 60-1" through 60-6". Each of the attenuator plugs 64-1" through 64-6" may be removed or replaced through openings 36" in the forward wall 14".

The rear wall 16" contains coax connectors 40-0" through 40-6". Coaxial cables (not shown in FIGS.) extend from each of the coax connectors 40-0" through 40-6" and beneath the printed circuit board 44" in a manner identical with that described with reference to the first preferred embodiment of FIG. 1. Further, as in the previous embodiment, circuit board 44" contains an electrically conductive layer opposing and electrically connected to surface 18". Also, the circuit paths on the upper surface of the board 44" are provided to balance impedances as previously described.

The coaxial cables will extend between the board 44" and the surface 18" for reasons previously discussed. The circuit paths on the board 44" are disposed such that six incoming signals may be separately connected to each of connectors 40-1" through 40-6" and passed through the individual attenuators 64-1" through 64-6" into the directional couplers 50-1" through 50-6" where the six signals will be joined into a common output signal passed to connector 40-0". As with the previous embodiment, a cover 100" covers the front face 14" together with a gasket 102" to prevent EMI.

All of the features of the module 10" are similar to the modules 10, 10' including the external dimensions and tabs of the modules such that the modules 10", 10' and 10 may be interchangeable in a common chassis. Further, the module 10" has the same impedance matching and parasitic reactance compensation previously mentioned with respect to module 10. As a result, the invention of modules 10 and 10' is incorporated into module 10" with module 10" showing a specific embodiment of the invention for use with a 6-port directional coupler circuit.

Figure 26:
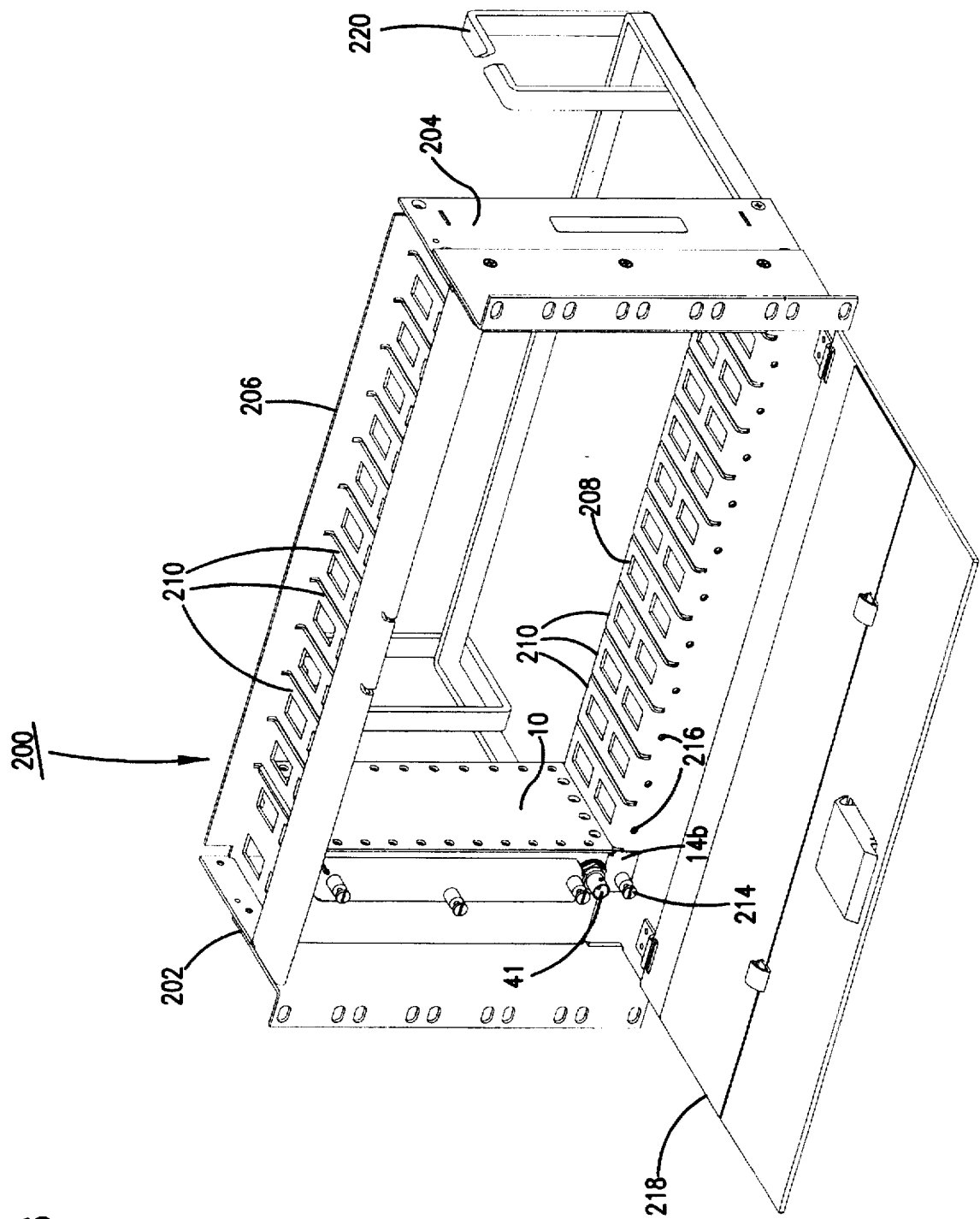
FIG. 26 is a perspective view of a first embodiment of a chassis for holding modules according to the present invention.

FIG. 26 shows a first chassis 200 for housing a plurality of modules 10. The chassis 200 includes horizontally spaced apart sidewalls 202,204 and vertically spaced apart top and bottom walls 206,208. The top and bottom walls 206,208 are spaced apart by a distance substantially equal to a distance between the end walls 22,24 of the module 10.

Each of the top and bottom walls 206,208 includes a plurality of vertically aligned grooves 210. The grooves 210 are sized to slidably receive the projecting flanges 20a,20b of the module 10 such that a module may be slidably inserted into the frame 200 with the modules 10 vertically positioned. In the embodiment shown, there are 12 pairs of vertically aligned grooves 210 such that 12 modules may be inserted into the frame 200. Since the flanges 20a,20b of the modules 10 are offset from a longitudinal plane of the module 10, the grooves 210 are offset from module receiving spaces so that the entire open space between the sidewalls of the frame may be filled with modules. Also, the grooves 210 are spaced apart a distance selected such that as modules are slidably inserted into the frame, adjacent modules are positioned with a small spacing between opposing sidewalls of adjacent modules 10.

Locking screws 214 are provided on the projecting tabs 14a,14b of the front walls 14 of the modules 10. Corresponding threaded locking holes 216 are provided on both the top and bottom walls 206,208 of the frame 200. The screws 214 are not centrally positioned on the tabs 14a,14b. Instead, they are laterally offset from a central longitudinal axis of the front wall 14. The holes 216 are similarly offset to require that a module 10 be placed in the frame 200 in a desired orientation and cannot be flipped 180° to be inserted in an undesired orientation. The frame 200 also includes a hinged cover 218 which preferably is transparent to permit an operator to inspect the interior. Cable management brackets 220 are provided on the rear of the chassis 200.

Figure 27:
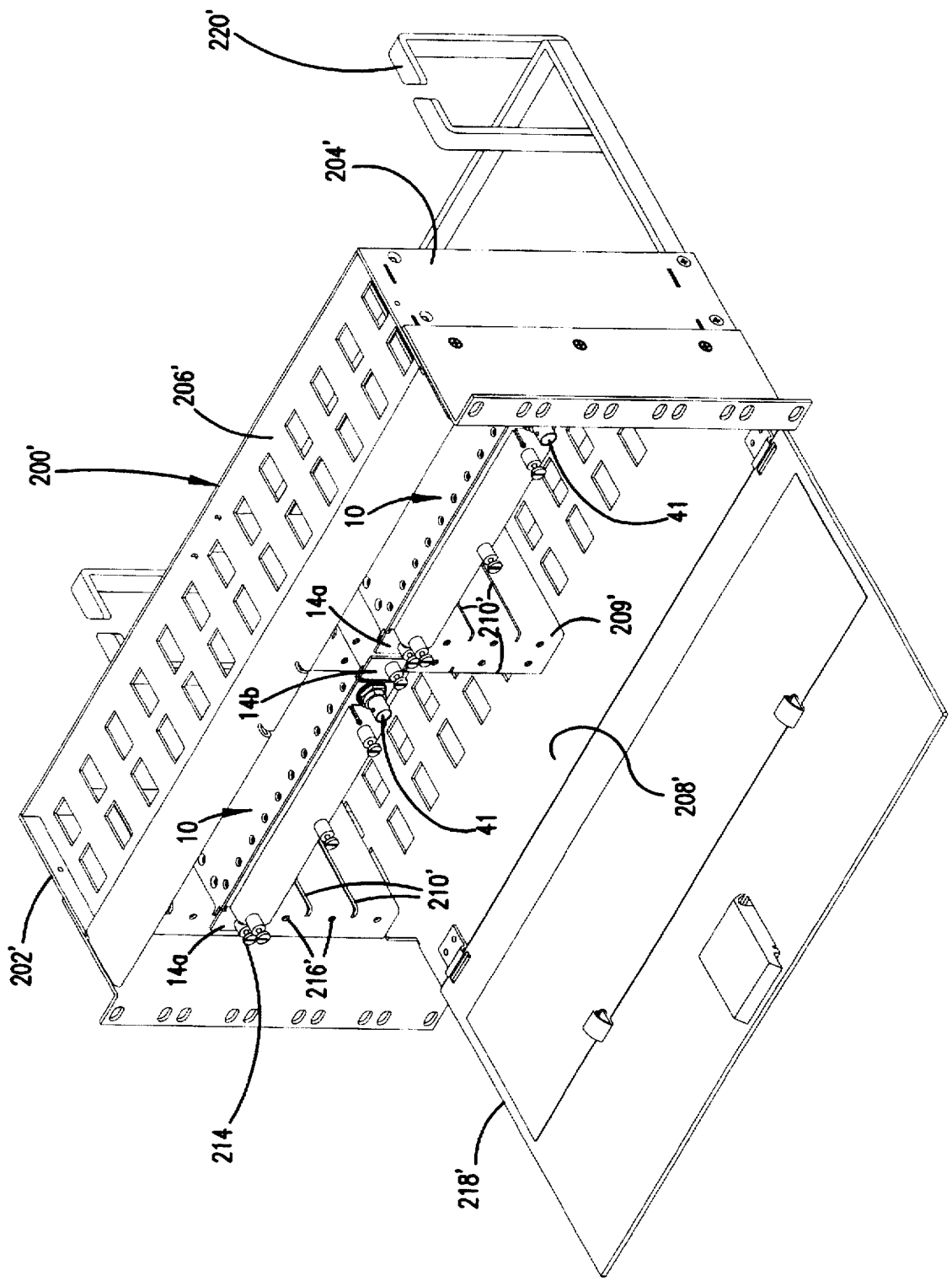
FIG. 27 is a perspective view of a second embodiment of a chassis for holding modules of the present invention.

From time to time, a customer or purchaser of the modules 10 may desire to hold the modules 10 in a horizontal alignment rather than the vertical alignment of FIG. 26. An alternative chassis 200' is shown in FIG. 27 for holding the modules 10 in a horizontal alignment. In FIG. 27, the chassis 200' includes horizontally spaced apart sidewalls 202',204' and vertically spaced apart top and bottom walls 206',208'. An intermediate wall 209' is provided midway and parallel to side walls 202',204'. The distance between either of side walls 202',204' and midwall 209' is equal to a distance between the end walls 22,24 of the module 10.

Each of the sidewalls 202',204' and the midwall 209' include a plurality of horizontally aligned grooves 210'. The grooves 210' are sized to slidably receive the projecting flanges 20a,20b of the module 10 such that a module may be slidably inserted into the frame 200' with the module 10 horizontally positioned.

In the embodiment shown in FIG. 27, there are six pairs of horizontally aligned grooves 210' on both sides of the center wall 209' such that the frame 200' can contain a total of 12 modules. As a result, chassis 200 and 200' give an operator the opportunity to contain the exact same number of modules 10 in either a horizontal or a vertical alignment as the operator may select.

Also, the locking screws 214 of the modules are aligned with locking holes 216' on the side walls 202',204' and mid wall 209'. Since the screws 214 are not centrally positioned on tabs 14a,14b, and the holes 216' are not centrally positioned in modules receiving spaces, a module 10 must be placed in the frame 200 in a desired orientation and cannot be flipped 180° to an undesired orientation. As in the embodiment of FIG. 26, the frame 200' of FIG. 27 includes a hinged cover 218' and cable management brackets 220'.

Figure 28:
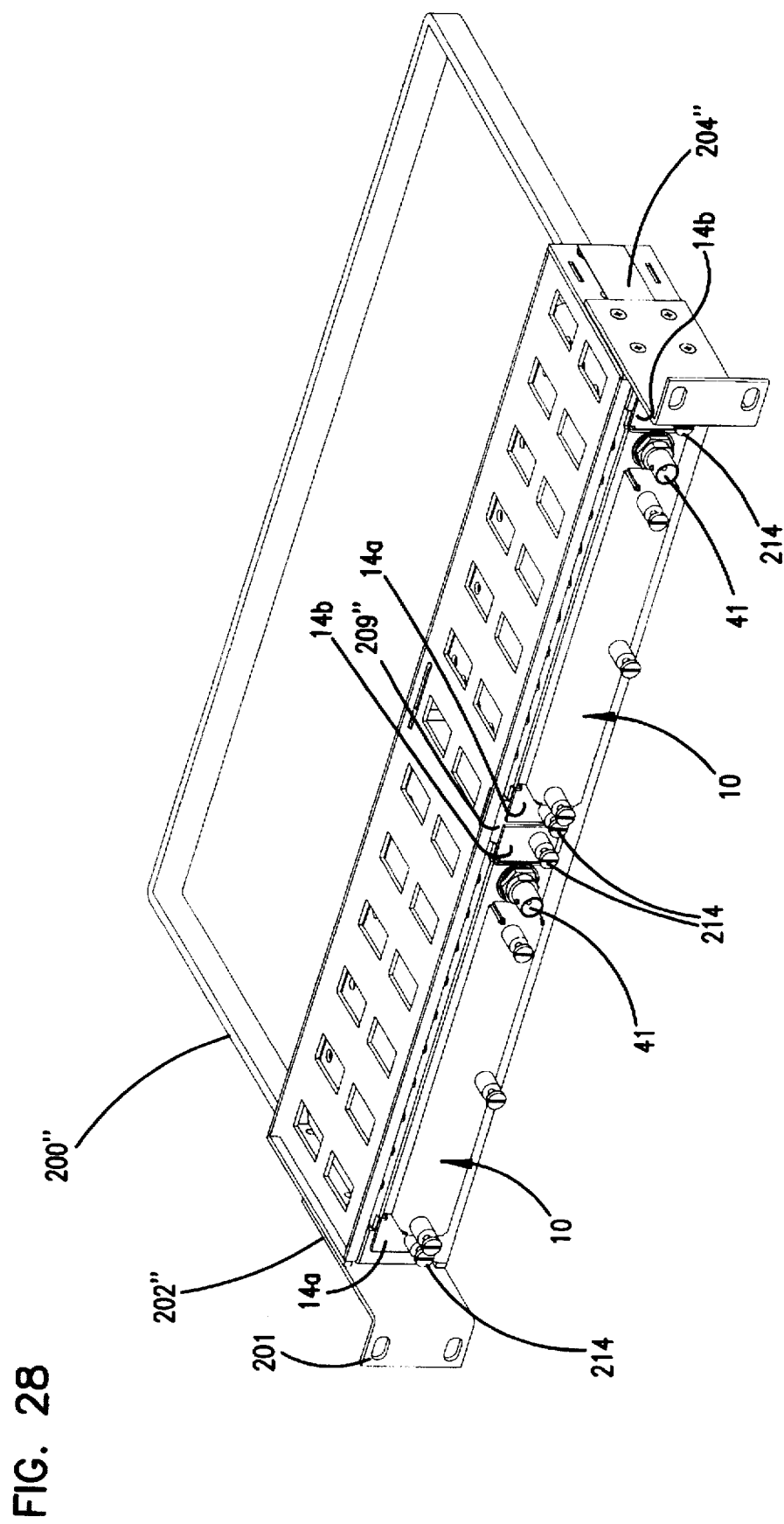
FIG. 28 is a perspective view of a third embodiment of a chassis for holding modules of the present invention.

Finally, FIG. 28 shows a chassis 200" which may be used in the event that an operator does not wish to have a combined total of 12 modules but instead only wishes to have a fewer number of modules. Chassis 200' retains two modules 10 in side-by-side horizontal alignment and includes mounting brackets 201 for mounting to a frame structure so that an operator can elect to mount pairs of modules at a time rather than twelve modules 10. Frame 200" is similar to frame 200' in that it has an intermediate wall 209" between side walls 202" and 204" with the locking screws 214 received within holes (not shown) of walls 202",204" and 209".

What is claimed is:

1. A module for containing a circuit for performing discrete circuit functions on a radio frequency signal, said module comprising:

a housing of electrically conductive material defining an enclosed interior;

said housing having a front face and an opposite rear face separated by opposite sidewalls and opposite end walls;

a plurality of coax connectors secured to said rear face with an outer shield of said connectors electrically coupled to said housing;

a circuit board contained within said interior and positioned generally parallel to and spaced between said sidewalls;

said circuit board having a component side opposing a first of said sidewalls and a ground side opposing a second of said sidewalls;

said ground side including a layer of electrically conductive material electrically connected to said housing;

a plurality of connection locations on said circuit board, each of said connection locations including a ground connection for connecting to said layer of electrically conductive material;

said component side of said circuit board including a plurality of circuit components interconnected with one another and with said connection locations through a plurality of circuit paths;

said coax connectors connected to said connection locations, each of said outer shields of said coax connectors connected to said ground connections of said connection locations;

said plurality of components including a coupler;

a removable equalizer for equalizing a radio frequency signal along a frequency range, said equalizer positioned along said front face;

said front face including an opening sized to pass said equalizer through said front face.

2. A module according to claim 1 including a plurality of coax cables disposed within said interior and connecting said coax connectors to said connection locations, each of said coax cables having ground shields connected to said outer shields of said coax connectors and to said ground connections of said connection locations, said plurality of cables routed for said cables to be disposed between said ground side of said circuit board and said second of said sidewalls.

3. A module according to claim 1 wherein said circuit paths are sized to have an impedance selected to balance a parasitic reactance between said circuit board and said housing.

4. A module according to claim 1 wherein said circuit components include a directional coupler.

5. A module according to claim 1, further comprising an electrically conductive cover releasably secured to said front face and sized to cover said opening.

6. A module according to claim 1, wherein said equalizer includes a first equalizer component mounted on said component side of said circuit board and a removable equalizer component removably secured to said first equalizer component with said removable equalizer component selected for a desired radio frequency equalization, said opening sized to pass said removable equalizer component through said front face.

7. A module according to claim 6, further comprising an electrically conductive cover releasably secured to said front face and sized to cover said opening.

8. A module according to claim 7, wherein said first equalizer component includes a base member, and said removable equalizer component includes a plug.

9. A module according to claim 6, wherein said first equalizer component includes a base member, and said removable equalizer component includes a plug.

* * * * *